United States Patent
Allan

(10) Patent No.: US 10,439,125 B2
(45) Date of Patent: Oct. 8, 2019

(54) METHODS OF MANUFACTURING SUPERCONDUCTOR AND PHONONIC ELEMENTS

(71) Applicant: UNIVERSITEIT LEIDEN, Leiden (NL)

(72) Inventor: Milan Allan, Leiden (NL)

(73) Assignee: Universiteit Leiden, Leiden (NL)

( * ) Notice: Subject to any disclaimer, the term of this patent is extended or adjusted under 35 U.S.C. 154(b) by 0 days.

(21) Appl. No.: 16/069,508

(22) PCT Filed: Jan. 12, 2017

(86) PCT No.: PCT/EP2017/050611
§ 371 (c)(1),
(2) Date: Jul. 11, 2018

(87) PCT Pub. No.: WO2017/121829
PCT Pub. Date: Jul. 20, 2017

(65) Prior Publication Data
US 2019/0019937 A1     Jan. 17, 2019

(30) Foreign Application Priority Data
Jan. 12, 2016   (GB) .................................. 1600532.4

(51) Int. Cl.
*H01L 39/12*     (2006.01)
*H01L 39/24*     (2006.01)

(52) U.S. Cl.
CPC ............ *H01L 39/12* (2013.01); *H01L 39/128* (2013.01); *H01L 39/24* (2013.01)

(58) Field of Classification Search
CPC ................................ H01L 39/12; H01L 39/24
(Continued)

(56) References Cited

U.S. PATENT DOCUMENTS

2013/0112496 A1    5/2013 Neogi et al.

FOREIGN PATENT DOCUMENTS

EP           0 449 019 A1   10/1991
WO    WO 2012/135683 A1   10/2012
(Continued)

OTHER PUBLICATIONS

International Search Report and Written Opinion, PCT/EP2017/050611, Universiteit Leiden, 9 pages (dated Apr. 21, 2017).
(Continued)

*Primary Examiner* — Timothy J Thompson
*Assistant Examiner* — Charles Pizzuto
(74) *Attorney, Agent, or Firm* — Foley & Lardner LLP

(57) ABSTRACT

There is provided methods of manufacturing a superconductor element and a method of manufacturing a phononic element. The method of manufacturing a superconductor element comprises the step of forming a periodic patterned structure in a material to alter an electronic structure in a primary layer (M) of the material to couple with the or each phonon of the primary layer (M) so as to induce superconductivity in the primary layer (M) or modify the superconductivity of the primary layer, and/or create or alter one or more phonons in a primary layer (M) of the material to couple with the electrons of the primary layer (M) so as to induce superconductivity in the primary layer (M) or modify the superconductivity of the primary layer. The method of manufacturing a phononic element comprises the steps of: providing one of a primary layer (M) and a secondary layer (M2) of a material on the other of the primary layer (M) and secondary layer (M2) of the material; and forming a periodic patterned structure in the secondary layer (M2) to create or alter one or more phonons in the primary layer (M).

15 Claims, 8 Drawing Sheets

(58) Field of Classification Search
USPC .................................................... 174/125.1
See application file for complete search history.

(56) References Cited

FOREIGN PATENT DOCUMENTS

WO    WO 2016/049446 A1 *   3/2016
WO    WO 2016/049446 A1     3/2016

OTHER PUBLICATIONS

El-Kady, I. et al., "Manipulation of thermal phonons: a phononic crystal route to High-ZT thermoelectrics," Photonic and Phononic Properties of Engineered Nanostructures (Bellingham, Washington), vol. 7946, No. 1, pp. 1-9 (Feb. 10, 2011) DOI: 10.1117/12.891066.

Cagliani et al., Large-area nanopatterned graphene for ultrasensitive gas sensing, Nano Research 2014, 7(5), pp. 743-754.
F. Marsiglio, J.P. Carbotte, The Physics of Conventional and Unconventional Superconductors' edited by K.H. Bennemann and J.B. Ketterson, Springer-Verlag.
G.M. Eliashberg, Zh. Eksperim, 38 966, Soviet Phys. JETP 11 696 (1960).
Jeon et al, Nanopillar InGaN/GaN light emitting diodes integrated with homogeneous multilayer graphene electrodes, Journal of Materials Chemistry, 21 (2011) 17688-17692.
R.D. Park, Superconductivity, Chapters 2 & 10, CRC Press (1969), ISBN 978082471520.
Safavi et al., Optomechanical Crystal Devices, Cavity-Optomechanics, Nano- and Micromechanical Resonators Interacting with Light, 2014, pp. 195-231.
Segall, M.D.; Lindan, P.J. (2002). Journal of Physics: Condensed Matter 14 (11).
N.W. Ashcroft, N.D. Mermin, Solid State Physics, Chapters 8-10 & 22-26, Cengage Learning (1976), ISBN: 0030839939.

* cited by examiner (a)

(b)

METHODS OF MANUFACTURING SUPERCONDUCTOR AND PHONONIC ELEMENTS

CROSS-REFERENCE TO RELATED APPLICATIONS

This application is a U.S. national stage of PCT/EP2017/050611, filed Jan. 12, 2017, which claims the benefit of and priority to Great Britain Patent Application No. 1600532.4, filed Jan. 12, 2016, both of which are incorporated herein by reference in their entireties.

TECHNICAL FIELD

This invention relates to methods of manufacturing a superconductor element, to superconductor elements, to a method of manufacturing a phononic element, and to a phononic element.

BACKGROUND

A quantized lattice vibration is known as a phonon. An electronic structure is the state of motion and the energy of electrons, and their relationship, in an electrostatic field created by stationary nuclei and the electrons.

SUMMARY

According to a first aspect of the invention, there is provided a method of manufacturing a superconductor element, the method comprising the step of forming a periodic patterned structure in a material to alter an electronic structure in a primary layer of the material to couple with the or each phonon of the primary layer so as to induce superconductivity in the primary layer or modify the superconductivity of the primary layer.

The formation of the periodic patterned structure in the material enables the use of the periodic patterned structure to alter one or more mechanical properties of the primary layer in a periodic manner in order to alter an electronic structure in the primary layer so that the electrons of the primary layer can be coupled with the or each phonon of the primary layer so as to induce superconductivity in the primary layer or modify the superconductivity of the primary layer. For example, the combination of the periodicity of the periodic patterned structure and the hardness of the primary layer leads to the alteration of the electronic structure in the primary layer, which may arise as a result of a change in hardness of the primary layer and/or the removal of parts of the material to form the periodic patterned structure. The parameters of the periodic patterned structure are selected to not only ensure the alteration of the electronic structure in the primary layer, but also to ensure that the coupling between the or each phonon and the electrons of the primary layer is sufficient to result in the induction of superconductivity in the primary layer or the modification of the superconductivity of the primary layer.

The induction of superconductivity in the primary layer may be applied to a primary layer based on one or more substances that exhibit nil superconductivity or superconductivity with a superconducting transition temperature that is lower than desired. The modification of the superconductivity of the primary layer may be applied to a primary layer based on one or more substances that exhibit superconductivity at a superconductor transition temperature that is different from the desired superconductor transition temperature.

Conventionally, if the requirement for a particular superconductive behaviour cannot be fulfilled using existing materials, it is necessary to produce new materials with different material compositions to manufacture a superconductor with the desired electronic structure. Such new materials (such as complex ceramics) not only can be complex and expensive to produce but also can be hard to use due to brittleness and unreliability. In addition, if a different superconductive behaviour is subsequently required, it is necessary to produce another material with a different material composition for the manufacture of the superconductor.

The use of the method of the invention to induce superconductivity in the primary layer or modify the superconductivity of the primary layer beneficially increases the range of materials that can be used in the manufacture of a superconductor element. This is because the method of the invention not only permits ready induction of superconductive behaviour in substances that previously exhibited nil superconductive behaviour or superconductive behaviour with a superconducting transition temperature that is lower than desired but also permits ready improvement of the superconductive behaviour of existing superconductor substances.

The increase in the range of materials that can be used in the manufacture of a superconductor element not only provides greater flexibility in selecting a material to achieve a desired superconductive behaviour, thus making it easier to select from materials that are simple and cheap to manufacture and/or are compatible with industrial processes, but also obviates the need to produce new materials with different material compositions when a different superconductive behaviour is required.

In addition, the parameters of the periodic patterned structure can be readily adjusted to provide the primary layer with a desired superconductive behaviour. This provides a simple and cost-effective way of tuning the superconductive behaviour of the resultant superconductor element to match the desired superconductive behaviour requirement, especially when compared to the complex and expensive production of new materials with different material compositions.

Inducing superconductivity in the primary layer or modifying the superconductivity of the primary layer may include increasing the superconductor transition temperature of the primary layer. This in turn allows the superconductor element to operate at higher temperatures, which reduces or eliminates the need for cooling equipment to cool the primary layer in order to achieve the superconductor transition temperature, unlike conventional superconductors (such as aluminium, lead, niobium, niobium titanate, niobium-zinc) that work at very low temperatures of circa $-273°$ C. to $-255°$ C.

The properties of the material and the parameters of the periodic patterned structure may vary, examples of which are described as follows.

The periodic patterned structure may include one or more nanostructures. This provides the periodic patterned structure with a reliable means of altering the electronic structure in the primary layer.

The primary layer may be a metallic layer and/or a superconductor layer. For example, the primary layer may include, but is not limited to, at least one of: aluminium, lead, niobium, magnesium diboride, graphene.

As mentioned above, the parameters of the periodic patterned structure can be readily adjusted to provide the primary layer with the desired superconductive behaviour. The step of forming a periodic patterned structure in a material to alter an electronic structure in a primary layer of the material may include forming the periodic patterned structure in the material to modify the electronic dispersion of the primary layer. For example, the step of forming a periodic patterned structure in a material to alter an electronic structure in a primary layer of the material may further include arranging the periodicity of the periodic patterned structure to define the electronic dispersion of the primary layer, and/or the step of forming a periodic patterned structure in a material to alter an electronic structure in a primary layer of the material may further include arranging the shape of the periodic patterned structure to define the electronic dispersion of the primary layer.

The method of the first aspect of the invention may be combined with a change of the phononic dispersion of the primary layer in order to obtain the desired effect of superconductivity of the primary layer.

Formation of the periodic patterned structure in the material to alter the electronic structure in the primary layer may be carried out in a number of different ways, examples of which are described as follows.

The step of forming a periodic patterned structure in a material to alter an electronic structure in a primary layer of the material may include forming the periodic patterned structure in the primary layer. This provides a reliable means for the periodic patterned structure to alter the mechanical properties of the primary layer to alter an electronic structure in the primary layer.

The step of forming a periodic patterned structure in a material to alter an electronic structure in a primary layer of the material may include forming the periodic patterned structure in a secondary layer of the material. Alternatively, the step of forming a periodic patterned structure in a material to alter an electronic structure in a primary layer of the material may include forming the periodic patterned structure in a secondary layer of the material, and the method may further include the step of providing the primary layer on the periodic patterned structure. The formation of the periodic patterned structure in the secondary layer also permits the periodic patterned structure to alter the mechanical properties of the primary layer to alter the electronic structure in the primary layer.

The periodic patterned structure in the secondary layer may be or may Include, but is not limited to, an array of pillars.

According to a second aspect of the invention, there is provided a superconductor element comprising a material, the material comprising a primary layer, the material further Including a periodic patterned structure formed therein, wherein the periodic patterned structure is arranged in the material to alter an electronic structure in the primary layer to couple with the or each phonon of the primary layer so as to induce superconductivity in the primary layer or modify the superconductivity of the primary layer.

The features and advantages of the method of the first aspect of the Invention and its embodiments apply mutatis mutandis to the superconductor element of the second aspect of the invention and its embodiments. Optional features of the superconductor element of the second aspect of the invention are described in, but not limited to, the dependent claims.

According to a third aspect of the invention, there is provided a method of manufacturing a superconductor element, the method comprising the step of forming a periodic patterned structure in a material to create or alter one or more phonons in a primary layer of the material to couple with the electrons of the primary layer so as to induce superconductivity in the primary layer or modify the superconductivity of the primary layer.

The formation of the periodic patterned structure in the material enables the use of the periodic patterned structure to alter one or more mechanical properties of the primary layer in a periodic manner in order to create or alter the or each phonon in the primary layer, which are then coupled with the electrons of the primary layer so as to induce superconductivity in the primary layer or modify the superconductivity of the primary layer. For example, the combination of the periodicity of the periodic patterned structure and the hardness of the primary layer leads to the creation or alteration of the or each phonon in the primary layer, which may arise as a result of a change in hardness of the primary layer and/or the removal of parts of the material to form the periodic patterned structure. The parameters of the periodic patterned structure are selected to not only ensure the creation or alteration of the or each phonon in the primary layer, but also to ensure that the coupling between the or each phonon and the electrons of the primary layer is sufficient to result in the induction of superconductivity in the primary layer or the modification of the superconductivity of the primary layer.

The induction of superconductivity in the primary layer may be applied to a primary layer based on one or more substances that exhibit nil superconductivity or superconductivity with a superconducting transition temperature that is lower than desired. The modification of the superconductivity of the primary layer may be applied to a primary layer based on one or more substances that exhibit superconductivity at a superconductor transition temperature that is different from the desired superconductor transition temperature.

Conventionally, if the requirement for a particular superconductive behaviour cannot be fulfilled using existing materials, it is necessary to produce new materials with different material compositions to manufacture a superconductor with the desired phononic dispersion. Such new materials (such as complex ceramics) not only can be complex and expensive to produce but also can be hard to use due to brittleness and unreliability. In addition, if a different superconductive behaviour is subsequently required, it is necessary to produce another material with a different material composition for the manufacture of the superconductor.

The use of the method of the invention to induce superconductivity in the primary layer or modify the superconductivity of the primary layer beneficially increases the range of materials that can be used in the manufacture of a superconductor element. This is because the method of the invention not only permits ready induction of superconductive behaviour in substances that previously exhibited nil superconductive behaviour or superconductive behaviour with a superconducting transition temperature that is lower than desired but also permits ready improvement of the superconductive behaviour of existing superconductor substances.

The increase in the range of materials that can be used in the manufacture of a superconductor element not only provides greater flexibility in selecting a material to achieve a desired superconductive behaviour, thus making it easier to select from materials that are simple and cheap to manufacture and/or are compatible with industrial processes, but also obviates the need to produce new materials with different material compositions when a different superconductive behaviour is required.

In addition, the parameters of the periodic patterned structure can be readily adjusted to provide the primary layer with a desired superconductive behaviour. This provides a simple and cost-effective way of tuning the superconductive behaviour of the resultant superconductor element to match the desired superconductive behaviour requirement, especially when compared to the complex and expensive production of new materials with different material compositions.

Inducing superconductivity in the primary layer or modifying the superconductivity of the primary layer may include increasing the superconductor transition temperature of the primary layer. This in turn allows the superconductor element to operate at higher temperatures, which reduces or eliminates the need for cooling equipment to cool the primary layer in order to achieve the superconductor transition temperature, unlike conventional superconductors (such as aluminium, lead, niobium, niobium titanate, niobium-zinc) that work at very low temperatures of circa −273° C. to −255° C.

The properties of the material and the parameters of the periodic patterned structure may vary, examples of which are described as follows.

The periodic patterned structure may include one or more nanostructures. This provides the periodic patterned structure with a reliable means of creating or altering the or each phonon in the primary layer.

The primary layer may be a metallic layer and/or a superconductor layer. For example, the primary layer may include, but is not limited to, at least one of: aluminium, lead, niobium, magnesium diboride, graphene.

As mentioned above, the parameters of the periodic patterned structure can be readily adjusted to provide the primary layer with the desired superconductive behaviour. For example, the step of forming a periodic patterned structure in a material to create or alter one or more phonons in a primary layer of the material may further include arranging the periodicity of the periodic patterned structure to define the phononic dispersion of the primary layer, and/or the step of forming a periodic patterned structure in a material to create or alter one or more phonons in a primary layer of the material may further include arranging the shape of the periodic patterned structure to define the phononic dispersion of the primary layer.

The induced or modified superconductive behaviour of the primary layer may be further designed by modifying the electronic dispersion of the primary layer so as to alter the induction of superconductivity in the primary layer or the modification of the superconductivity of the primary layer.

The step of forming a periodic patterned structure in a material to create or alter one or more phonons in a primary layer of the material may include forming the periodic patterned structure in the material to modify the electronic dispersion of the primary layer. This, together with the change of the phononic dispersion of the primary layer, may be preferred to obtain the desired effect of superconductivity of the primary layer. This obviates or reduces the need to resort to other ways to modify the electronic dispersion of the primary layer.

Furthermore the step of forming a periodic patterned structure in a material to create or alter one or more phonons in a primary layer of the material may further include arranging the periodicity of the periodic patterned structure to define the electronic dispersion of the primary layer, and/or the step of forming a periodic patterned structure in a material to create or alter one or more phonons in a primary layer of the material may further include arranging the shape of the periodic patterned structure to define the electronic dispersion of the primary layer.

Formation of the periodic patterned structure in the material to create or alter the or each phonon in the primary layer may be carried out in a number of different ways, examples of which are described as follows.

The step of forming a periodic patterned structure in a material to create or alter one or more phonons in a primary layer of the material may include forming the periodic patterned structure in the primary layer. This provides a reliable means for the periodic patterned structure to alter the mechanical properties of the primary layer to create or alter the or each phonon in the primary layer.

The step of forming a periodic patterned structure in a material to create or alter one or more phonons in a primary layer of the material may include forming the periodic pattered structure in a secondary layer of the material. Alternatively, the step of forming a periodic patterned structure in a material to create or alter one or more phonons in a primary layer of the material may include forming the periodic pattered structure in a secondary layer of the material, and the method may further include the step of providing the primary layer on the periodic patterned structure. The formation of the periodic patterned structure in the secondary layer also permits the periodic patterned structure to alter the mechanical properties of the primary layer to create or alter the or each phonon in the primary layer.

The periodic patterned structure in the secondary layer may be or may include, but is not limited to, an array of pillars.

According to a fourth aspect of the invention, a superconductor element comprising a material, the material comprising a primary layer, the material further including a periodic pattered structure formed therein, wherein the periodic patterned structure is arranged in the material to create or alter one or more phonons in the primary layer to couple with the electrons of the primary layer so as to induce superconductivity in the primary layer or modify the superconductivity of the primary layer.

The features and advantages of the method of the third aspect of the invention and its embodiments apply mutatis mutandis to the superconductor element of the fourth aspect of the invention and its embodiments. Optional features of the superconductor element of the fourth aspect of the invention are described in, but not limited to, the dependent claims.

According to a fifth aspect of the invention, there is provided a method of manufacturing a phononic element, the method comprising the steps of: providing one of a primary layer and a secondary layer of a material on the other of the primary layer and secondary layer of the material; and forming a periodic patterned structure in the secondary layer to create or alter one or more phonons in the primary layer.

The formation of the periodic patterned structure in the secondary layer permits the periodic patterned structure to alter the mechanical properties of the primary layer in a periodic manner to create or alter the or each phonon in the primary layer. Such creation or alteration of the or each phonon in the primary layer may be used in a range of applications, such as the manufacture of superconductors and the field of semiconductor physics.

When the primary layer is provided on the secondary layer, the primary layer may be provided on the periodic patterned structure. In such embodiments the periodic patterned structure in the secondary layer may be or may include, but is not limited to, an array of pillars.

The properties of the material and the parameters of the periodic patterned structure may vary, examples of which are described as follows.

The periodic patterned structure may include one or more nanostructures. This provides the periodic patterned structure with a reliable means of creating or altering the or each phonon in the primary layer.

The primary layer may be a metallic layer and/or a superconductor layer. For example, the primary layer may include, but is not limited to, aluminium, gold, magnesium diboride and/or graphene.

The parameters of the periodic patterned structure can be readily adjusted to provide the primary layer with the desired phononic dispersion. For example, the step of forming a periodic patterned structure in the secondary layer to create or alter one or more phonons in the primary layer may further include arranging the periodicity of the periodic patterned structure to define the phononic dispersion of the primary layer, and/or the step of forming a periodic patterned structure in the secondary layer to create or alter one or more phonons in the primary layer may further include arranging the shape of the periodic patterned structure to define the phononic dispersion of the primary layer.

According to a sixth aspect of the invention, there is provided a phononic element comprising a material, the material comprising a primary layer and a secondary layer, the material further including a periodic patterned structure formed therein, wherein one of the primary and secondary layers of the material is provided on the other of the primary and secondary layers of the material; and the periodic patterned structure is arranged in the secondary layer to create or alter one or more phonons in the primary layer.

The features and advantages of the method of the fifth aspect of the Invention and its embodiments apply mutatis mutandis to the phononic element of the sixth aspect of the invention and its embodiments. Optional features of the phononic element of the sixth aspect of the invention are described in, but not limited to, the dependent claims.

BRIEF DESCRIPTION OF THE FIGURES

Preferred embodiments of the invention will now be described, by way of non-limiting examples, with reference to the accompanying drawings in which.

DETAILED DESCRIPTION

Figure 1:
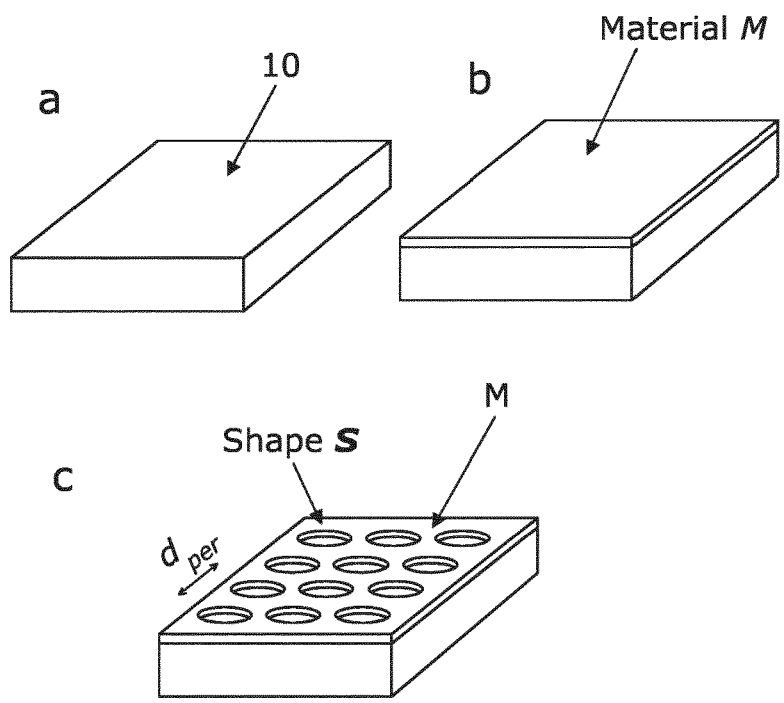
FIGS. 1, 2a and 2b illustrate processes of forming a periodic patterned structure in a material.

A first process of forming a periodic patterned structure in a material to manufacture a superconductor element is shown in FIG. 1 and is described as follows.

The first process includes an initial step of preparing a clean and flat substrate 10, e.g. a standard oxidized silicon wafer, followed by the formation of a primary layer in the form of a thin film of metal M with a thickness of $d_{film} \approx 200$ nm on the substrate. In the process of FIG. 1 the thin film of metal M is formed by means of evaporation while the metal M is magnesium diboride with a superconducting transition temperature $T_{CM}$. It will be appreciated that the selection of magnesium diboride for use in this process is merely exemplary, and another substance may be used in place of magnesium diboride.

A thin film of resist is coated on the primary layer, which can be carried out using conventional coating techniques such as spin-coating. A periodic nanostructure with shape S and periodicity $d_{per}$, which may be in the range of circa 5 nm to circa 100 nm (or less), is then formed in the thin film of resist through exposure of part of the thin film of resist, which can be carried out using standard photolithography, focused ion beam lithography (e.g. with He or Gd ions), or electron beam writing techniques. The shape S is a circle, and so the periodic nanostructure is in the form of an array of circles.

The formation of the periodic patterned nanostructure in the thin film of resist enables selective etching of the metal M to form a periodic patterned nanostructure in the primary layer. The formation of the periodic patterned nanostructure in the primary layer changes the hardness of the thin film of metal M in a periodic manner, which in turn results in the primary layer having a new superconducting transition temperature $T_{CM}{}^{1}$, which is higher than the original superconducting transition temperature $T_{CM}$.

The first process therefore involves the formation of the periodic patterned nanostructure directly in the primary layer.

Figure 2A:
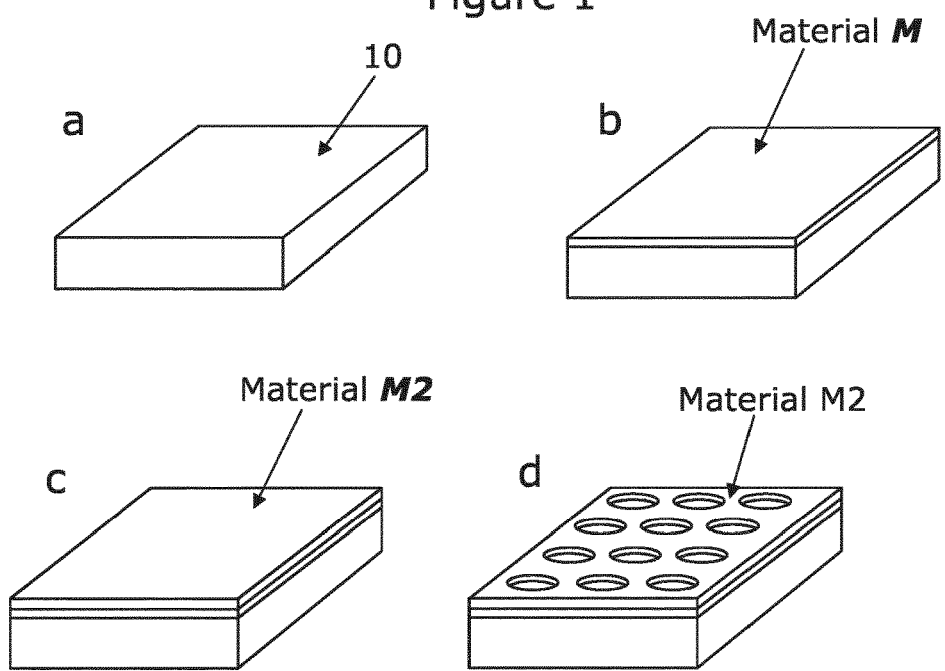

A second process of forming a periodic patterned structure in a material to manufacture a superconductor element is shown in FIG. 2a and is described as follows.

The second process includes an initial step of preparing a clean and flat substrate 10, e.g. a standard oxidized silicon wafer, followed by the formation of a primary layer in the form of a thin film of metal M with a thickness of $d_{film} \approx 200$ nm on the substrate. This is then followed by the formation of a secondary layer in the form of a thin film of hard, insulating material M2 (such as titanium) with a thickness of $d_{film} \approx 200$ nm on the thin film of metal M. In the process of FIG. 2 both the thin film of metal M and the thin film of insulating material M2 is formed by means of evaporation while the metal M is magnesium diboride with a superconducting transition temperature $T_{CM}$. It will be appreciated that the selection of magnesium diboride for use in this process is merely exemplary, and another substance may be used in place of magnesium diboride.

A thin film of resist is coated on the secondary layer, which can be carried out using conventional coating techniques such as spin-coating. A periodic nanostructure with shape S and periodicity $d_{per}$, which may be in the range of circa 5 nm to circa 100 nm (or less), is then formed in the thin film of resist through exposure of part of the thin film of resist, which can be carried out using standard photolithography, focused ion beam lithography (e.g. with He or Gd ions), or electron beam writing techniques. The shape S is a circle, and so the periodic nanostructure is in the form of an array of circles.

The formation of the periodic patterned nanostructure in the thin film of resist enables selective etching of the insulating material M2 to form a periodic patterned nanostructure in the secondary layer. The formation of the periodic patterned nanostructure in the primary layer changes the hardness of the underlying parts of the thin film of metal M in a periodic manner, which in turn results in the primary layer having a new superconducting transition temperature $T_{CM}'$, which is higher than the original superconducting transition temperature $T_{CM}$. Each element of the periodic patterned nanostructure formed from the etched insulating material M2 influences the phononic dispersion of the primary layer individually and increases the phonon energies of the primary layer.

Figure 2B:
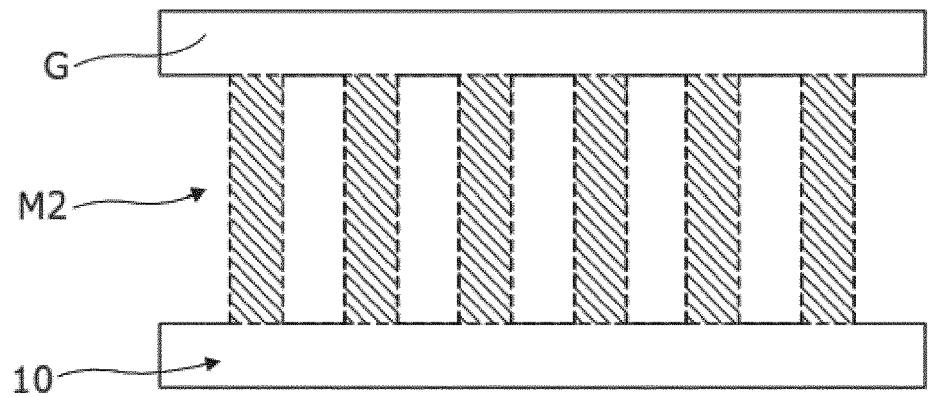

A third process of forming a periodic patterned structure in a material to manufacture a superconductor element is shown in FIG. 2b described as follows.

The third process includes an initial step of preparing a clean and flat substrate 10, e.g. a standard oxidized silicon wafer, followed by the formation of a periodic nanostructure M2 patterned on the substrate. The periodic nanostructure M2 is in the form of an array of pillars, each of which has the shape S. The shape S is a circle, and so the periodic nanostructure M2 is in the form of an array of cylindrical pillars.

A primary layer in the form of a thin film of graphene G with a thickness of $d_{film} \approx 200$ nm is then placed on top of the array of pillars. The thin film of graphene G is prepared using standard thin film preparation means, which includes lift-off of the thin film of graphene G in order to allow its placement on top of the array of pillars. In the process of FIG. 2b the graphene G has a superconducting transition temperature $T_{CM}$. It will be appreciated that the selection of graphene for use in this process is merely exemplary, and another substance may be used in place of graphene.

The use of the periodic patterned nanostructure to support parts of the primary layer changes the hardness of the supported parts of the thin film of metal M/graphene G in a periodic manner, which in turn results in the primary layer having a new superconducting transition temperature $T_{CM}'$, which is higher than the original superconducting transition temperature $T_{CM}$.

The second and third processes therefore involve the formation of the periodic patterned nanostructure directly in a secondary layer adjacent the primary layer.

It will be appreciated that, for the purposes of this specification, placing a first layer on a second layer is intended to cover both: the placing of the first layer directly on the second layer, where there is no intermediate layer between the first and second layers; and the placing of the first layer indirectly on the second layer, where one or more intermediate layers are provided between the first and second layers.

It is therefore envisaged that, in other embodiments of the invention, one or more intermediate layers may be provided between the secondary layer and the primary layer. The provision of the or each intermediate layer allows for the use of a wider range of fabrication techniques, since it is not essential for the secondary layer to direct contact the primary layer. The or each intermediate layer is dimensioned to be sufficiently thin so as to permit the periodic patterned nanostructure formed in the secondary layer to change the hardness of the primary layer in a periodic manner in order to result in the primary layer having the new superconducting transition temperature $T_{CM}'$.

Figure 3:
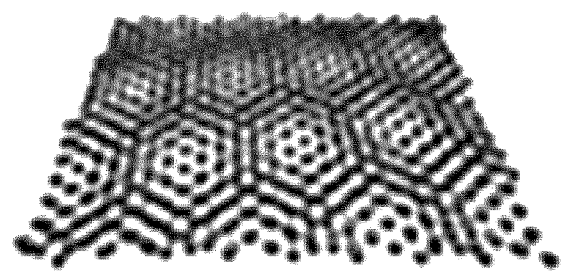
FIG. 3 illustrates the formation of a periodic patterned nanostructure using Moire engineering and atomic scale manipulation.
Figure 3:
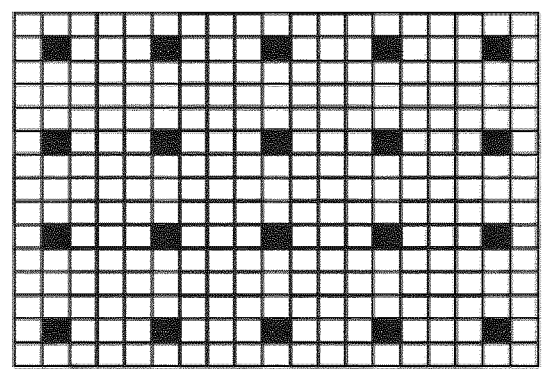

In other embodiments of the invention, it is envisaged that the periodic patterned nanostructure may be formed by way of 3D stacking, self-assembly, Moire engineering as shown in FIG. 3(a), or atomic scale manipulation (e.g. with a scanning probe microscope) as shown in FIG. 3(b).

In the superconductor element manufactured using each of the above processes, the increase in the superconducting transition temperature of the primary layer from $T_{CM}$ to $T_{CM}'$ is determined by the design of the parameters of the periodic patterned nanostructure to create or alter one or more phonons in the primary layer that couple with the electrons of the primary layer to modify the superconductivity of the primary layer, as detailed below.

In the superconductor element manufactured using the first process, the increase in the superconducting transition temperature of the primary layer from $T_{CM}$ to $T_{CM}'$ may optionally be determined by the design of the parameters of the periodic patterned nanostructure to 30o modify the electronic dispersion of the primary layer. This is because a change in the electronic dispersion of the primary layer affects the modification of the superconductivity of the primary layer, as detailed below.

Exemplary parameters of the periodic patterned nanostructure are described as follows.

The first parameter relates to the choice of process, such as the first, second and third processes described above, to manufacture the superconductor element. The choice of process determines how the mechanical properties of the primary layer are altered by the inclusion of the periodic patterned structure in either the primary or secondary layer.

The second parameter relates to the choice of substance for the primary layer. Examples of the primary layer includes, but are not limited to, aluminium, lead, niobium, magnesium diboride, niobium-zinc and niobium titanate. The material for the primary layer may also be replaced by other substances, such as graphene. Preferably the chosen substance exhibits superconductivity at low superconductor transition temperatures. Also preferably the chosen substance may exhibit nil superconductivity or superconductivity with a superconducting transition temperature that is lower than desired, in which case the role of the periodic patterned nanostructure is to create or alter one or more phonons in the primary layer that couple with the electrons of the primary layer in order to induce superconductivity in the primary layer.

The third parameter relates to the choice of periodicity $d_{per}$ of the periodic patterned nanostructure which defines the phononic dispersion of the primary layer (and optionally the electronic dispersion of the primary layer). The periodicity $d_{per}$ in the first, second and third processes may be in the nm range or less, but preferably varies in the range of 1 nm to 50 nm, or in the range of 5 to 50 lattice constants.

Figure 4:
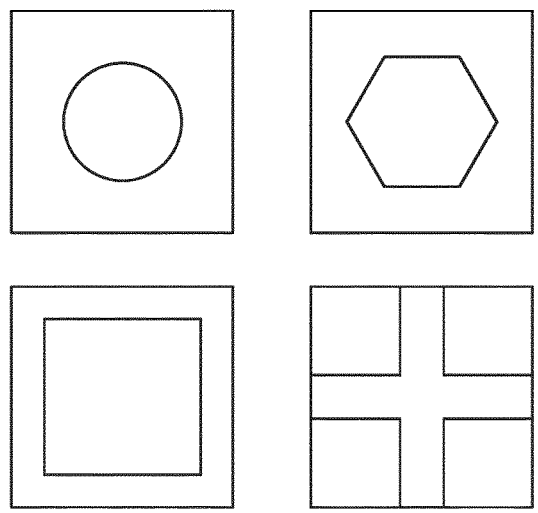
FIG. 4 shows further examples of shapes S for the periodic patterned structure of FIGS. 1, 2a and 2b.

The fourth parameter relates to the choice of shape S of the periodic patterned nanostructure which defines the phononic dispersion of the primary layer (and optionally the electronic dispersion of the primary layer). The shape S in the first, second and third processes is a circle but may be, for example, a hexagon, square or a cross, as shown in FIG. 4.

Superconductors are materials that conduct electricity without resistance at low temperatures. They work on the basis of the coupling of electrons, the charge carrier responsible for electrical conductivity, to phonons, i.e. quantized lattice vibrations. If the electrons, phonons and their mutual coupling in a given material have the correct form and strength, the material exhibits superconductivity.

The parameters are chosen to obtain the phonons in the primary layer that can couple with the electrons of the primary layer in order to induce superconductivity in the primary layer or modify the superconductivity of the primary layer.

The desired phononic dispersion of the primary layer is designed and the band-gaps are associated in a way to maximize coupling to the electrons of the primary layer that results in an increase in the superconducting transition temperature of the primary layer from $T_{CM}$ to $T_{CM}'$. In particular, the phononic dispersion of the primary layer is designed to include high phonon density states to the energy $\omega_{tc}$ and phonons with wave vectors q that connect states on the electron Fermi surface, and to have a sufficiently high number of low energy phonon states.

The choice of periodicity $d_{per}$ influences the density of the phonon modes in the q axis of phase space. A larger periodicity $d_{per}$ results in more phonon branches, and vice versa. For the primary layer, the same principle holds for the electronic structure. Moreover a larger periodicity $d_{per}$ results in more and smaller phononic band-gaps, and vice versa.

The choice of shape S influences the detailed shape of both the band-gaps and the phononic dispersions at small wave vectors.

The phononic dispersion of the primary layer can be calculated based on the parameters as follows.

Firstly, based on the periodic patterned nanostructure, the primary layer may be regarded as a system of masses and springs. Such a system is described with Newton's equations, which lead to a set of coupled differential equations. These can be solved analytically or numerically based on the complexity of the periodic patterned nanostructure. The phonons in the primary layer can then be obtained from the normal modes via canonical transformation.

Secondly, the primary layer may be approximated as an elastic medium. The phonons in the primary layer are then calculated using finite element approximation. This may be done numerically, for example, using commercial software packages such as COMSOL™.

If the periodic patterned nanostructure is designed to modify the electronic dispersion of the primary layer, the electronic dispersion of the primary layer can be calculated based on the parameters.

The desired electronic dispersion of the primary layer is designed and the band-gaps are associated in a way to maximize coupling to the phonons in the primary layer that results in an increase in the superconducting transition temperature of the primary layer from $T_{CM}$ to $T_{CM}'$. This is done by having a sufficiently high number of states about the Fermi energy (by being close but not inside electronic band-gaps), a sufficiently large amount of phase space at the Fermi energy, and the right Fermi surface topology to connect to the phonons [Refs: R. D. Parks, Superconductivity, CRC Press (1969), ISBN 9780824715205; [F. Marsiglio, J. P. Carbotte, The Physics of Conventional and Unconventional Superconductors' edited by K. H. Bennemann and J. B. Ketterson, Springer-Verlag, referred to hereon as "Carbotte01"].

The electronic dispersion of the primary layer can be calculated based on the parameters as follows.

Firstly, the band structure of the primary layer may be approximated using the formalism of the second quantization and a tight binding model [Ref: N. W. Ashcroft, N. D. Mermin, Solid State Physics, Cengage Learning (1976), ISBN: 0030839939]. The change of the tight binding parameters due to the periodic patterned nanostructure is then calculated to adjust the tight-binding model and numerically calculate the electronic dispersion of the primary layer.

Secondly, the electronic dispersion may be numerically calculated using the local density approximation.

The coupling between the phonons and electrons in the primary layer before the formation of the periodic patterned nanostructure can be modelled using the standard SSH-Hamiltonian description [Ref: Carbotte01]:

$$H = \sum_i \frac{p_i^2}{2M} + \sum_{<ij>} \frac{1}{2}K(u_i - u_j)^2 - \sum_{\substack{<ij> \\ \sigma}} \left(t_{ij} - \alpha \cdot (u_i - u_j)\right)\left(c_{i\sigma}^\dagger c_{j\sigma} + h.c.\right)$$

Where u is the atomic displacement operator;
p is the atomic impulse;
M is the mass;
K is the spring constant;
$\alpha$ is the coupling constant and
the "c" operators are the creation and annihilation operators of electronic states.

Other Hamiltonians, which are based on the theory of quantum mechanics, may be used [Ref: Carbotte01].

The earlier calculated phonon and electronic dispersions are incorporated by adapting the SSH Hamiltonian description, while the local coupling between the phonons and electrons in the primary layer remain the same as this is not directly changed by the periodic patterned nanostructure. The SSH-Hamiltonian description then undergoes a Fourier Transform to obtain the electron-phonon coupling function $\lambda(q,\omega)$:

$$\lambda_{Qv} = \frac{2}{\omega_{Qv} N(0)} \sum_k |M_{k,k+Q}^v|^2 \delta(\varepsilon_k) \delta(\varepsilon_{k+Q})$$

Where $\lambda_{Qv}$ is the coupling projected on wave vector Q and band v;
$\omega_{Qv}$ is the phonon energy at wave vector Q and band v;
$M_{k,k+Q}$ is the matrix element to couple electronic states with wave vectors k and k+Q;
$\varepsilon_k$ are the electron energies at wave vectors k; and
$\delta$ is the Dirac delta function.

Figure 5:
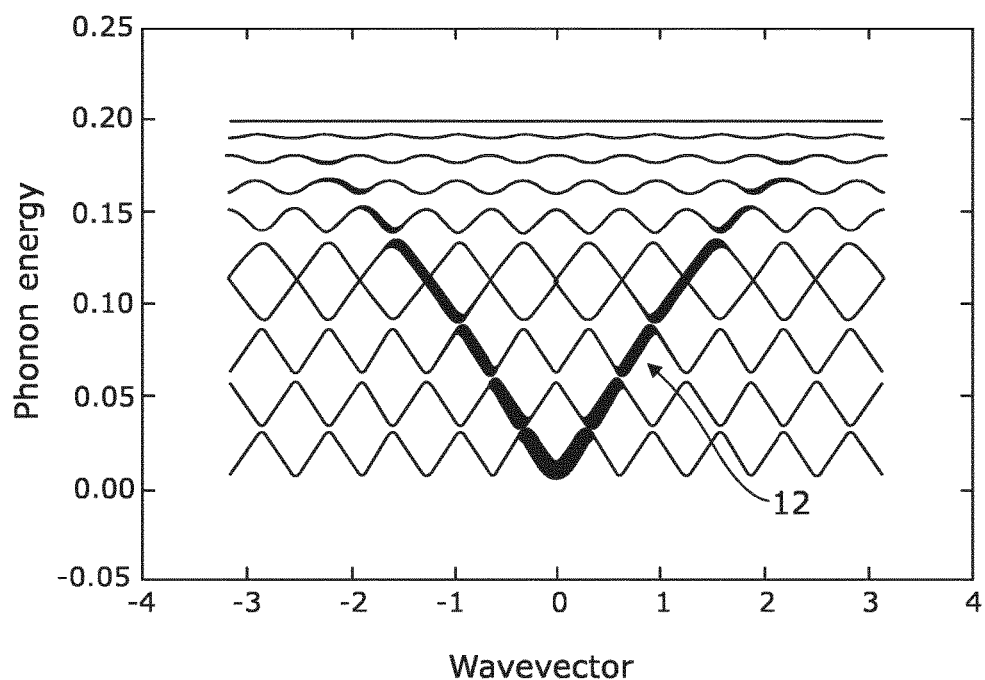
FIG. 5 shows an exemplary electron-phonon coupling function $\lambda(q,\omega)$.

FIG. 5 shows an example of the electron-phonon coupling function $\lambda(q,\omega)$, where the horizontally extending light grey "wavy" lines represent the designed phononic dispersion, and the dark grey dots 12, which apparently form a "V" line 12, represent the $\lambda(q,\omega)$ relevant for superconductivity. The thickness of the dots 12 indicates the value of $\lambda(q,\omega)$, i.e. the strength of the coupling between the electrons and phonons.

The superconducting transition temperature $T_{CM}$ is then calculated using the coupling function $\lambda(q,\omega)$ and the electronic dispersion $\omega_e(k)$, where k and q are wave vectors, and w are energies. To do so, we use the Eliashberg equations [Ref: G. M. Eliashberg, Zh. Eksperim, 38 966 (1960); Soviet Phys. JETP 11 696 (1960)].

$$\sum(k, i\omega_m) \equiv \frac{1}{N\beta} \sum_{k',m'} \frac{\lambda_{kk'}(i\omega_m - i\omega_{m'})}{N(\mu)} G(k', i\omega_{m'})$$

-continued $$\phi(k, i\omega_m) \equiv \frac{1}{N\beta} \sum_{k',m'} \left( \frac{\lambda_{kk'}(i\omega_m - i\omega_{m'})}{N(\mu)} - V_{kk'} \right) F(k', i\omega_{m'})$$

$$G(k, i\omega_m) = \frac{G_n^{-1}(k, i\omega_m)}{G_n^{-1}(k, i\omega_m) G_n^{-1}(-k, -i\omega_m) - \phi(k, i\omega_m)\overline{\phi}(k, i\omega_m)}$$

$$F(k, i\omega_m) = \frac{\phi(k, i\omega_m)}{G_n^{-1}(k, i\omega_m) G_n^{-1}(-k, -i\omega_m) - \phi(-k, -i\omega_m)\overline{\phi}(-k, -i\omega_m)}$$

$$G_n^{-1}(k, i\omega_m) = G_0^{-1}(k, i\omega_m) - \sum(k, i\omega_m)$$

Where $\Sigma$ indicates a summation;
k is the electron wave vector;
N is the number of particles;
$\beta$ is the inverse temperature;
$\phi$ is the complex gap function;
$\mu$ is the chemical potential;
$V_{kk'}$ is the scattering element for an electron from k to k';
$\omega_m$ is the Matsubara frequencies;
G and F are the Green's function of electrons and phonons respectively; and
$\lambda$ is the electron phonon coupling element.

The following specific examples illustrate the determination of the superconducting transition temperature $T_{CM}$ of the superconductor element manufactured using the above first, second and third processes.

In a first specific example with reference to the first process, a tight binding model is designed for the electronic structure of the primary layer, and the phononic dispersion of the primary layer is calculated based on spring constant (using nearest-neighbour-interaction) and mass. The atomic structure of the primary layer is assumed to be a square lattice with: (i) a lattice constant $a_0=0.5$ nm; (b) electron hopping t1=3, t2=1, t3=0 for nearest, next-nearest, and next-next-nearest neighbour transitions; and (c) a chemical potential mu=−10, all in natural units. We assume the ions to have a mass of 10 atomic units and a spring constant of 1 inbetween them. The periodic patterned nanostructure in the primary layer is designed to consist of square holes with a periodicity of $50a_0$.

From these values, it is possible to calculate the new electronic and phononic dispersions of the primary layer, as well as the coupling between the phonons and electrons in the primary layer, in terms of the SSH-Hamiltonian description. Thereafter the increase in the electron boson coupling lambda A is calculated as a function of wave vector and band index. Using the simplest approximation for the superconducting transition temperature $T_{CM}$, the new superconducting transition temperature $T_{CM}'$ is found to be higher by 16% over the original superconducting transition temperature $T_{CM}$.

In a second specific example with reference to the second process, the addition of a secondary layer with circular holes on top of the primary layer influences the phononic dispersion of the primary layer (by influencing the local hardness), but does not affect the electronic dispersion of the primary layer. A tight binding model is designed for the electronic structure of the primary layer, and the phononic dispersion of the primary layer is calculated based on spring constant (using nearest-neighbour-interaction) and mass. The atomic structure of the primary layer is assumed to be a square lattice with: (i) a lattice constant $a_0=0.5$ nm; (b) electron hopping t1=3, t2=1, t3=0 for nearest, next-nearest, and next-next-nearest neighbour transitions; and (c) a chemical potential mu=−10, all in natural units. We assume to the ions to have a mass of 10 atomic units and a spring constant of 1 inbetween them. The periodic patterned nanostructure in the secondary layer is designed to consist of circular holes with a periodicity of $50a_0$. The periodic patterned nanostructure is modelled as a change in mass of the ions below the holes to 80 atomic mass units.

Figure 6:
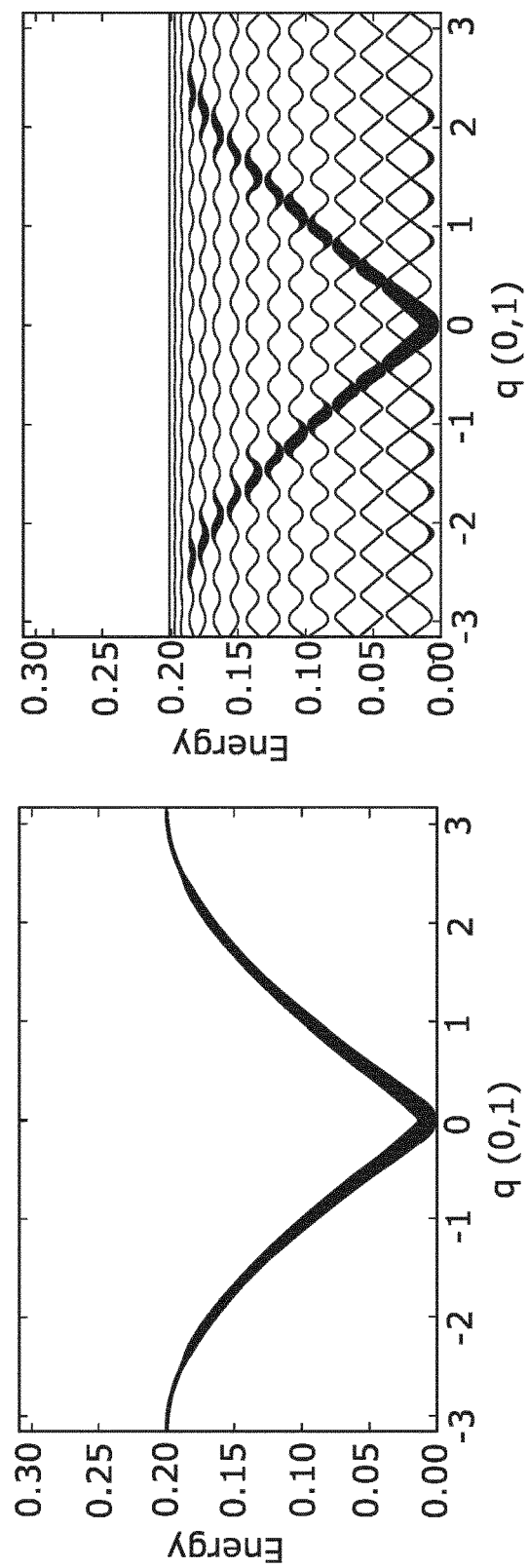
FIG. 6 compares the electron-phonon coupling before and after the formation of the periodic patterned structure in the material taking into account the phononic structure only.

From these values, it is possible to calculate approximately the new electronic and phononic dispersions of the primary layer, as well as the coupling between the phonons and electrons in the primary layer, in terms of the SSH-Hamiltonian description. Thereafter the increase in the electron boson coupling lambda A is calculated as a function of wave vector and band index. The left graph "A" of FIG. 6 shows the electron-phonon coupling before the addition of the periodic patterned structure to the secondary layer, while the right graph "B" of FIG. 6 shows the electron-phonon coupling after the addition of the periodic patterned structure to the secondary layer. A comparison of the two graphs of FIG. 6 shows that the addition of the periodic patterned structure to the second layer results in new coupling between the electrons and phonons arising at different points. Using the simplest approximation for the superconducting transition temperature $T_{CM}$, the new superconducting transition temperature $T_{CM}'$ is found to be higher by 20% over the original superconducting transition temperature $T_{CM}$.

In a third specific example with reference to the third process, the use of an array of pillars to support parts of the primary layer (which is graphene in this specific example) influences the phononic dispersion of the primary layer (by influencing the local hardness), but does not affect the electronic dispersion of the primary layer. A tight binding model is designed for the electronic structure of the primary layer, and the phononic dispersion of the primary layer is calculated based on spring constant (using nearest-neighbour-interaction) and mass. The atomic structure of the primary layer is assumed to be a hexagonal lattice with: (i) a lattice constant $a_0=0.25$ nm; (b) electron hopping t1=3, t2=1, t3=0 for nearest, next-nearest, and next-next-nearest neighbour transitions; and (c) a chemical potential mu=−10, all in natural units. We assume the ions to have a mass of 10 atomic units and a spring constant of 1 inbetween them. The periodic patterned nanostructure in the secondary layer is designed to consist of pillars with circular cross-sections with periodicity of $80a_0$. The periodic patterned nanostructure is modelled as a change in spring constant of the ions above the pillars by a factor of 1.5.

From these values, it is possible to calculate the new electronic and phononic dispersions of the primary layer, as well as the coupling between the phonons and electrons in the primary layer, in terms of the SSH-Hamiltonian description. Thereafter the increase in the electron boson coupling lambda A is calculated as a function of wave vector and band index. Using the simplest approximation for the superconducting transition temperature $T_{CM}$, the new superconducting transition temperature $T_{CM}'$ is found to be higher over the original superconducting transition temperature $T_{CM}$.

It will be understood that the above second and third processes of forming a periodic patterned structure in a material may also be applied to the manufacture of the phononic element. Similarly the above design of the phononic dispersion of the primary layer may be applied to the manufacture of the phononic element. It will be appreciated that the electronic dispersion of the primary layer and its coupling with the phonons of the primary layer may be of secondary concern or not applicable at all.

In a further embodiment of the invention the periodic patterned nanostructure may be formed in the material to alter an electronic structure in a primary layer of the material to couple with the or each phonon of the primary layer so as to induce superconductivity in the primary layer or modify the superconductivity of the primary layer, where the formation of the periodic patterned nanostructure does not create or alter the or each phonon of the primary layer. Instead the or each phonon of the primary layer may already be present in 30o the primary layer prior to the formation of the periodic patterned nanostructure, or may be created in the primary layer via other means.

The above first, second and third processes of forming a periodic patterned structure in a material, and their variations, are applicable mutatis mutandis to the formation of the periodic patterned structure in the material to alter an electronic structure in the primary layer.

In the superconductor element manufactured using each of the above processes, the increase in the superconducting transition temperature of the primary layer from $T_{CM}$ to $T_{CM'}$ is determined by the design of the parameters of the periodic patterned nanostructure to alter the electronic structure in the primary layer that couple with the or each phonon of the primary layer to modify the superconductivity of the primary layer, as detailed below.

Exemplary parameters of the periodic patterned nanostructure are described as follows.

The first parameter relates to the choice of process, such as the first, second and third processes described above, to manufacture the superconductor element. The choice of process determines how the mechanical properties of the primary layer, and therefore the electronic structure in the primary layer, are altered by the inclusion of the periodic patterned structure in either the primary or secondary layer.

The second parameter relates to the choice of substance for the primary layer. Examples of the primary layer includes, but are not limited to, aluminium, lead, niobium, magnesium diboride, niobium-zinc and niobium titanate. The material for the primary layer may also be replaced by other substances, such as graphene. Preferably the chosen substance exhibits superconductivity at low superconductor transition temperatures. Also preferably the chosen substance may exhibit nil superconductivity or superconductivity with a superconducting transition temperature that is lower than desired, in which case the role of the periodic patterned nanostructure is to alter the electronic structure in the primary layer that couple with the or each phonon of the primary layer in order to induce superconductivity in the primary layer.

The third parameter relates to the choice of periodicity $d_{per}$ of the periodic patterned nanostructure which defines the electronic dispersion of the primary layer. The periodicity $d_{per}$ in the first, second and third processes may be in the nm range or less, but preferably varies in the range of 1 nm to 50 nm, or in the range of 5 to 50 lattice constants.

The fourth parameter relates to the choice of shape S of the periodic patterned nanostructure which defines the electronic dispersion of the primary layer. The shape S in the first, second and third processes is a circle but may be, for example, a hexagon, square or a cross, as shown in FIG. 4.

An exemplary model for determining the effect of a periodic patterned nanostructure on the electronic structure of a primary layer of a material is described as follows. In this model, it is assumed that the periodic patterned nanostructure takes the form of a square lattice with a nano-patterned supercell, and is to be formed in the material.

The pristine material, i.e. prior to the formation of the periodic patterned nanostructure therein, is modelled as a two-dimensional square lattice with N×N sites described by the Hamiltonian:

$$H = H_{el} + H_{ph} + H_{el\text{-}ph}$$

where $H_{el}$, $H_{ph}$ and $H_{el\text{-}hp}$ are the electronic, phononic and interaction parts of the Hamiltonian respectively.

For the electronic part $H_{el}$, a tight-binding description on the ions' equilibrium positions is used assuming nearest-neighbour hopping only with hopping element t:

$$H_{el} = -t \sum_{(x,x')} c_x^\dagger c_{x'} + \mu \sum_x c_x^\dagger c_x$$

where the "c" operators are the creation and annihilation operators of electronic states, and x denotes the lattice sites. The electron creation operators in momentum space are $$c_x^\dagger = \frac{1}{N} \sum_k e^{-ik \cdot x} c_k^\dagger \text{ with}$$

$$k_x, k_y \in \left\{ -\frac{\pi}{a}, -\frac{\pi}{a}\frac{N-1}{N}, \ldots \frac{\pi}{a}\frac{N-1}{N} \right\},$$

where a is the lattice constant. Replacing them in the Hamiltonian leads to:

$$H_{el} = \sum_k \varepsilon_k c_k^\dagger c_k$$

where $\varepsilon_k$ is the electronic dispersion. Next, acoustic phonons are considered as follows:

$$H_{ph} = \sum_x \frac{p_x^2}{2m} + \frac{\kappa}{2} \sum_{(x,x')} (u_x - u_{x'})^2$$

where $p_x$ represents the ion momenta, $u_x$ represents the deviations of the ions from equilibrium at site x (i.e. the phonon displacement field), m represents the ion mass, and κ is the spring constant. In the above sum, (x,x') again denotes nearest neighbours. The phonon Hamiltonian can be written in second-quantized form by introducing the phonon creation and annihilation operators $a_q, a_q^\dagger$. The displacement of the ion at site x is then given by:

$$u_x = \frac{1}{N} \sum_q e_q e^{iq \cdot x} u_q = \frac{1}{N} \sum_q e_q e^{iq \cdot x} \left( \frac{\hbar}{2m\omega_q} \right)^{\frac{1}{2}} (a_q + a_{-q}^\dagger)$$

where $e_q$ is the displacement unit vector and $\omega_q = [4\kappa(\sin^2 q_x/2 + \sin^2 q_y)/m]^{1/2}$ the phonon energy at wave vector q.

The coupling of the electrons to the lattice is introduced by considering the energy change of the electronic states when the background (ion) density changes as the crystal expands/contracts, which is analogous to the dependence of the chemical potential on the density for a free electron gas. This leads to the interaction Hamiltonian $$H_{el\text{-}ph} = \tilde{C} \sum_x \frac{\Delta V_x}{V} c_x^\dagger c_x$$

where $c_x^\dagger$ creates an electron on lattice site x. This term describes the shift in chemical potential an electron feels due to the deformation of the (positive) lattice background. The constant $\tilde{C}$ indicates the proportionality in change of the chemical potential and volume change $\Delta V/V$, and is commonly called displacement potential. In general $\tilde{C}$ indicates the shape of the atomic potential. For acoustic phonons, the volume change is approximately given by the divergence of the displacement field, $$\frac{\Delta V_x}{V} \approx \vec{\nabla} \cdot \vec{u}_x$$

where $u_x$ is the phonon displacement field. The electrons thus only couple to longitudinal phonons, and only these modes will be considered. Discretizing the phonons, it was found that:

$$\nabla \cdot u_x \approx \frac{1}{2a}\left(u^x_{X+\hat{x}} - u^x_{X-\hat{x}} + u^y_{X+\hat{y}} - u^y_{X-\hat{y}}\right) =$$

$$\frac{i}{N}\sum_q (\sin^2 q_x + \sin^2 q_y)^{\frac{1}{2}} e^{iq\cdot x} \left(\frac{\hbar}{2m\omega_q}\right)^{\frac{1}{2}} (a_q + a^\dagger_{-q})$$

with $\hat{x}$ and $\hat{y}$ as the unit vectors in the corresponding direction. Inserting the above equation into the interaction Hamiltonian yields:

$$H_{el-ph} =$$

$$\tilde{C}\sum_x \frac{\Delta V_x}{V} c_x^\dagger c_x = \frac{i}{N}\sum_R \sum_{k,k',q} e^{i(q+k'-k)\cdot x} C_q \left(\frac{\hbar}{2m\omega_q}\right)^{\frac{1}{2}} (a_q + a^\dagger_{-q}) c_k^\dagger c_{k'} =$$

$$\frac{i}{N}\sum_{k,q} g_q (a_q + a^\dagger_{-q}) c^\dagger_{k+q} c_k$$

with the coupling matrix element as:

$$g_q = \tilde{C}(\sin^2 q_x + \sin^2 q_y)^{\frac{1}{2}}\left(\frac{\hbar}{2m\omega_q}\right)^{\frac{1}{2}} = C_q \left(\frac{\hbar}{2m\omega_q}\right)^{\frac{1}{2}}$$

where $C_q$ is the momentum dependent proportionality. For small values of q, the coupling matrix element is given by $\tilde{C} \cdot q$, but more generally the coupling matrix element is related to the Fourier transform of the atomic potential. One can further use different forms of couplings $g_q$ to model different materials.

Given the above interaction matrix element, the dimensionless coupling parameter $\lambda$ can be expressed as:

$$\lambda = \sum_{k,q} \frac{2}{\omega_q N(0)} |g_{k,k+q}|^2 \delta(\varepsilon_k) \delta(\varepsilon_{k+q})$$

The product of the delta functions $\delta(\varepsilon_k)\delta(\varepsilon_{k+q})$ ensures that only electrons at the Fermi level contribute to yield a kinematic constraint (assuming that phonon energies are much smaller than the Fermi energy). The q or k dependence of the electron-phonon coupling parameter, $\lambda_q$ and $\lambda_k$ can be calculated by summing over all other variables. This yields the contributions of a given phonon mode q or the contributions of a given electronic state k to the electron-phonon coupling parameter $\lambda$.

Figure 7:
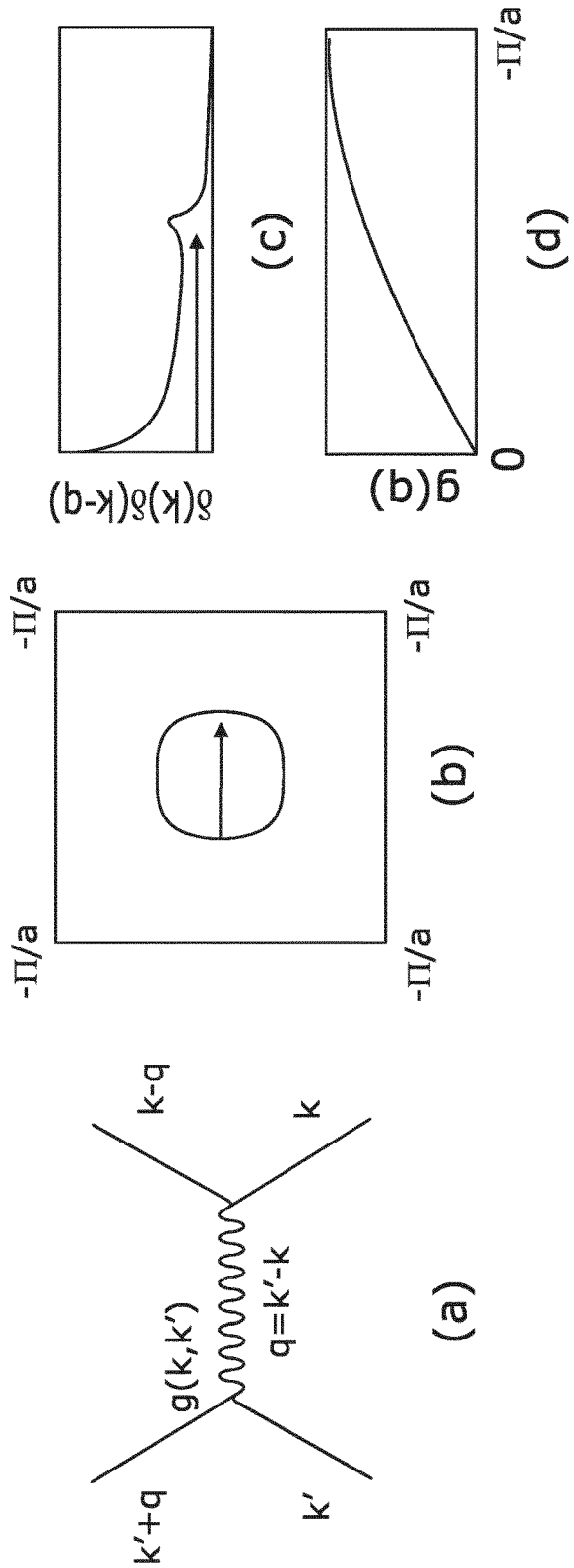
FIG. 7 illustrates an electron-phonon interaction and an electron-phonon coupling parameter of the material.

FIG. 7 illustrates the electron-phonon interaction and the electron-phonon coupling parameter $\lambda$. FIG. 7a shows a diagrammatic representation of the coupling between electrons k,k' through the exchange of a phonon q. The relevant interaction is with $\varepsilon_k = \varepsilon_{k'} = 0$ (i.e. at the Fermi level). The momentum space resolved interaction matrix element for each vertex is $g_{kk'}$. FIG. 7b shows that only scattering vectors (indicated by the arrow) connecting the Fermi surface points are relevant, which is due to the $\delta(\varepsilon_k)\delta(\varepsilon_{k+q})$ term. FIG. 7c shows the kinematic constraint along a high-symmetry direction, while FIG. 7d shows that a high electron-phonon coupling $\lambda$ is achieved if the interaction matrix element is high where the kinematic constraints are fulfilled, and the electronic density of states at the Fermi level is high.

The transition temperature $T_{CM}$ can be calculated using, for example, the standard Bardeen-Cooper-Schrieffer (BCS) theory or Allen-Dynes approximation in Eliashberg theory. Using the BCS theory, the standard exponential dependence of the transition temperature $T_{CM}$ on $\lambda$ is given as:

$$T_{CM} = 1.13 \omega_D e^{-\frac{1}{P}}$$

where $\omega_D$ is a frequency measure of the phonon energy which is usually taken to be the Debey energy. Using Eliashberg theory we can approximate the transition temperature $T_{CM}$ by:

$$k_B T_{CM} = \frac{\hbar \omega_{ln}}{1.2} \exp\left(\frac{1.04(1+P)}{P - \mu^*(1 + 0.62P)}\right)$$

where $\mu^*$ is the coulomb pseudopotential, and $\omega_{ln}$ is the logarithmic average of the phonon energy as defined by:

$$\omega_{ln} = \exp\left(\frac{2}{P}\int_0^\infty d\upsilon \ln(\upsilon) \frac{\alpha^2 F(\upsilon)}{\upsilon}\right) \text{ with}$$

$$\alpha^2 F(\upsilon) = \frac{1}{N(0)} \sum_q \sum_k \delta(\upsilon - \omega_q)|g_{k,k+q}|^2 \delta(\varepsilon_k)\delta(\varepsilon_{k+q})$$

A supercell with L×L sites is now considered. The number of supercells is denoted by $M^2 = (N/L)^2$, each containing $L^2$ ions, giving the same total number of atomic sites as the pristine model, $N^2$. The equilibrium position of each ion is indicated by $x = R + \tau$, where R is the position of the supercell and $\tau$ is the position within the supercell. The deviation of the ions from their equilibrium position is denoted by $\mu_x$ and the electron creation (annihilation) operators by $c_x^\dagger (c_x)$. Allowing for arbitrary chemical potentials $\mu_\tau$ at site $\tau$ inside the supercell and arbitrary hopping constants $t_{\tau,\tau'}$ for neighbouring sites $\tau$ and $\tau'$ within the supercell, all preserving the L-periodicity, the electronic part of the Hamiltonian is given by:

$$H_{el} = -\sum_{(x,x')} t_{\tau,\tau'} c_x^\dagger c_{x'} + \sum_x \mu_\tau c_x^\dagger c_x$$

Figure 8:
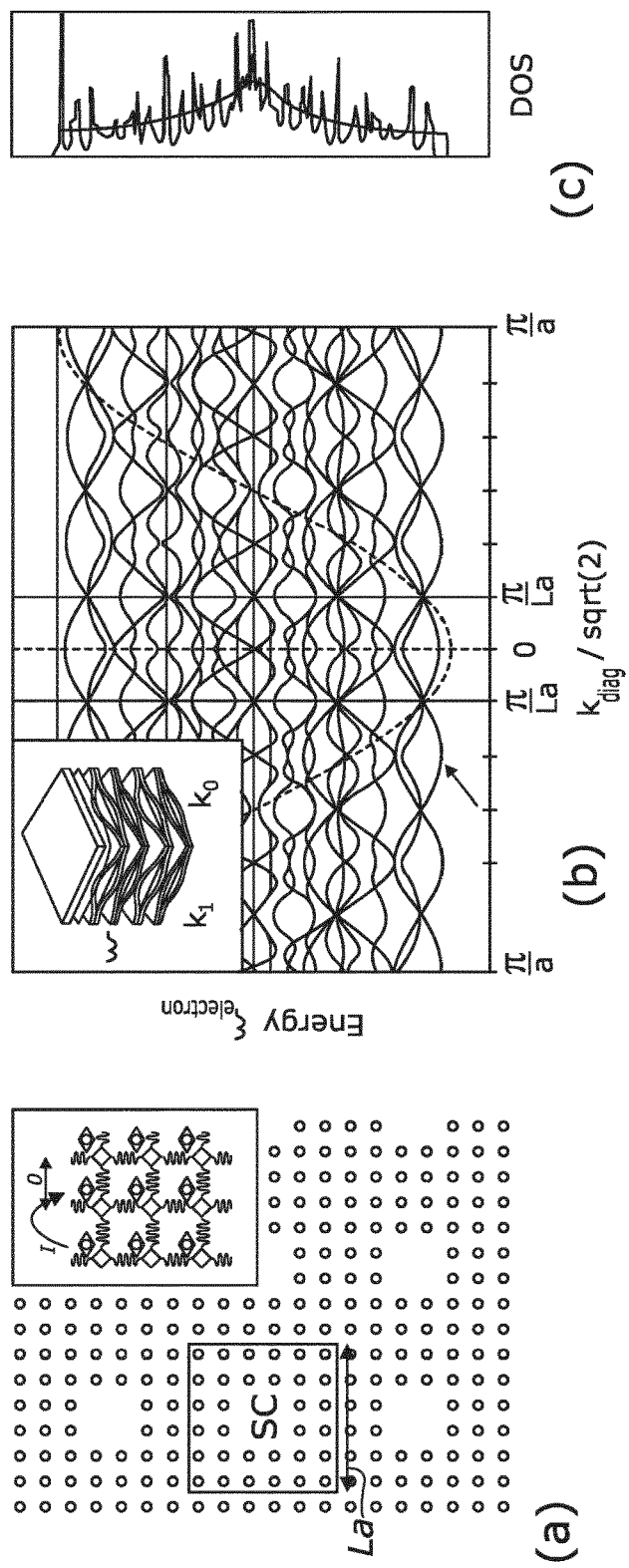
FIGS. 8 and 9 illustrate the increase in the electron-phonon coupling parameter as a result of the formation of the periodic patterned structure to alter an electronic structure only in a primary layer of a material in a simple model.
Figure 8:
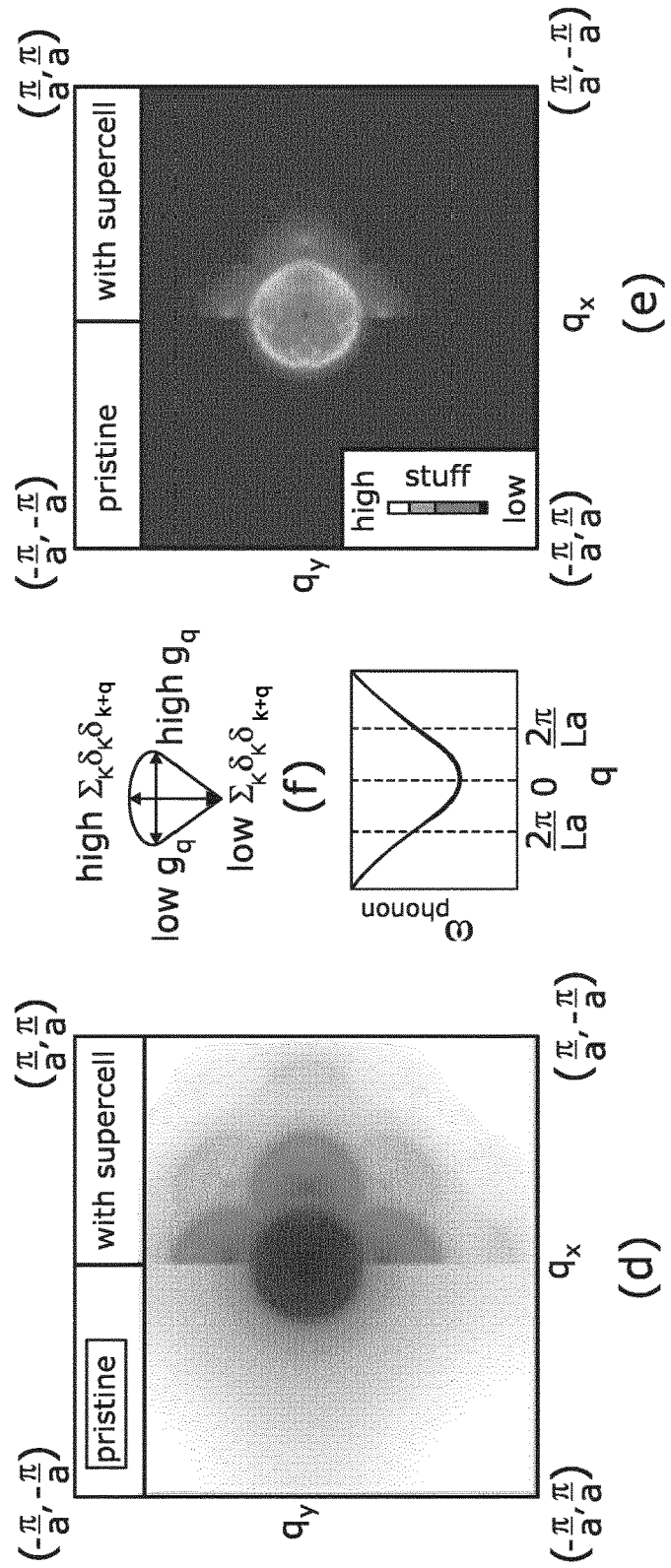

The modelled material with the periodic patterned nanostructure formed therein includes a supercell of L×L lattice sites and a square hole in the centre (for example a 6×6 supercell with a 2×2 hole as shown in FIG. 8a), which corresponds to the material shown in FIG. 1c in combination with the square hole shown in FIG. 4. The new supercell periodicity is reflected in a reduction of the Brillouin zone (BZ) area by a factor $L^2$ (as shown in FIG. 8b which includes a plot of the full Brillouin zone of the pristine material) and $L^2$ back-folded bands with band gaps at the new BZ boundary. The Hamiltonian is then expressed in block-diagonal form by introducing a Fourier transform of the electron operators with respect to the new periodicity $$c_{\{x=R+\tau\}} = \frac{1}{M} \sum_K e^{iK \cdot R} c_K^\tau$$

Here and in the following, capital letters $K=(K_x, K_y)$ are used to denote the reciprocal wave vectors with respect to the supercell periodicity L, i.e., $$K_x, K_y \in \left\{ -\frac{\pi}{La}, -\frac{\pi}{La}\frac{M-1}{M}, \ldots \frac{\pi}{La}\frac{M-1}{M} \right\}$$

This leads to the block diagonal Hamiltonian:

$$H_{el} = \sum_K \vec{c}_K^\dagger [H_K] \vec{c}_K$$

where we introduced the vectors of operators $\vec{c}_K = (c_K^1, c_K^2, \ldots c_K^{L \times L})$. To simplify the notation, we use a single index here and later instead of a vector $\tau$ for the position within the supercell. The block matrices $[H_K]$ contain all the chemical potentials $\mu_u$ and hopping terms $t_{u'u}$ within the supercell.

Each block Hamiltonian $[H_K]$ is an $L^2 \times L^2$ matrix. It contains diagonal elements with the chemical potentials of all $L^2$ sites, and all the hopping elements are contained as well as the phase factors for connections between sites in adjoint supercells. Specifically, its elements are:

$$[H_K]^{vv'} = \mu_v \delta_{vv'} - t_{v,v} \delta_{(v,v')} - t_{v,v'} \delta_{(v,v')} - t_{v,up} \delta_{(v,up)}$$
$$e^{-iLK_y} - t_{v,down} \delta_{(v,down)} e^{iLK_y} - t_{v,right} \delta_{(v,right)}$$
$$e^{iLK_x} - t_{v,left} \delta_{(v,left)} e^{iLK_x}$$

where again we use a single index to denote the position in the supercell, and $\delta_{vv'}$ is one only when u and u' are the same while $\delta_{(uu')}$ is one only when u and u' are nearest neighbours. $\delta_{(u,right)}$ is one only when u is nearest neighbour to a site in the next supercell to the right, $\delta_{(u,left)}$ is one only when u is nearest neighbour to a site in the next supercell to the left, $\delta_{(u,up)}$ is one only when u is nearest neighbour to a site in the next supercell upwards, and $\delta_{(u,down)}$ is one only when u is nearest neighbour to a site in the next supercell downwards.

It is instructive to look at this in one dimension, in which case the block Hamiltonian $[H_K]$ is an L×L matrix:

$$[H_K] = \begin{bmatrix} \mu_1 & -t_{12} & & & -t_{1,L}e^{-i(La)K} \\ -t_{21} & \mu_2 & & & \\ & & \ddots & & \\ & & & \mu_{L-1} & -t_{L-1,L} \\ -t_{L,1}e^{-i(La)K} & & & -t_{L,L-1} & \mu_L \end{bmatrix}$$

Finally, diagonalizing the matrices $[H_K]$ for each K yields the diagonal basis vectors $\gamma_K^v$, the corresponding eigenvalues $\xi_K^v$ and transformation matrices $[U_K]^{\tau v}$ such that:

$$c_K^\tau = \sum_v [U_K^\dagger]^{\tau v} \gamma_K^v$$

$$H_{el} = \sum_K \sum_v \xi_K^v (\lambda_K^v)^\dagger \gamma_K^v$$

In order to express the Hamiltonian, the real space electron operators are expressed in terms of the diagonal basis states $\gamma_K^v$:

$$c_{\{x=R+\tau\}} = \frac{1}{M} \sum_K \sum_v e^{iK \cdot R} [U_K^\dagger]^{\tau v} \gamma_K^v$$

In principle, the calculation can be carried out using any kind of supercell with different chemical potentials $\mu_\tau$ and hopping $t_{\tau\tau'}$. To model the hole, we designate some sites as part of the hole. These sites have zero hopping probability to all neighbours, leaving the states completely non-dispersive. For simplicity, the chemical potential is increased at all hole sites, to move the non-dispersive states above the all the relevant bands, to ensure that they are not taken into account in relation to superconductivity.

Next the new interaction matrix element $g_{kk'}^{SC}$ of the material with the periodic patterned nanostructure formed therein is expressed as a function of the electronic structure $\xi_K^v$ and the interaction matrix element $g_q^p$ of the pristine material. The pristine material has an interaction Hamiltonian given by:

$$H_{el\text{-}ph} = -i \sum_{qk} g_q^p c_k^\dagger c_k (a_q + a_{-q}^\dagger) \text{ with}$$

$$g_q^p = C_q q \left( \frac{\hbar}{2mN\omega_q} \right)^{\frac{1}{2}}$$

The general interaction Hamiltonian with the supercell is of the form:

$$H_{el\text{-}ph} = \sum_x \underbrace{C \vec{\nabla} \cdot u_x}_{(I)} \underbrace{c_k^\dagger c_k}_{(II)}$$

The operators of the pristine material $c_k, c_k^\dagger$ are respectively replaced with the operators of the new basis $\gamma, \gamma^\dagger$. Hence, it follows that:

$$(II) = c_k^\dagger c_k$$
$$= \frac{1}{M^2} \sum_{KK'} \sum_{vv'} \left[ e^{iK \cdot R} (\gamma_K^v)^\dagger U_K^{v\tau} \right] \left[ e^{-iK' \cdot R} [U_{K'}^\dagger]^{\tau v'} \gamma_{K'}^{v'} \right]$$
$$= \frac{1}{M^2} \sum_{KK'} \sum_{vv'} e^{i(K-K') \cdot R} [U_K]^{v\tau} [U_{K'}^\dagger]^{\tau v'} (\gamma_K^v)^\dagger \gamma_{K'}^{v'}$$

Using $\frac{1}{M^2} \sum_R e^{i(q-K+K') \cdot R} = \sum_{n=1} \delta_{K,K'+Q+\frac{2\pi}{La}l}$, with -continued $$q = Q + \frac{2\pi}{La}l,$$

$$H_{el\text{-}ph} = \sum_x C\vec{\nabla} \cdot u(x) c_k^\dagger c_k$$

$$= i\frac{1}{M^2 N} \sum_x \sum_{K,K'} \sum_{Q,l} \sum_{\upsilon\upsilon'}$$

$$e^{i(K-K'-Q)\cdot R}[U_K]^{\upsilon\tau}[U_{K'}^\dagger]^{\tau\upsilon'}(\gamma_K^\upsilon)^\dagger \gamma_{K'}^{\upsilon'} \times$$

$$C_q e^{iq\tau} \left(\frac{\hbar}{2m\omega_q}\right)^{\frac{1}{2}}(a_q + a_{-q}^\dagger)$$

$$= i\sum_{KQ} \sum_l \sum_\tau \sum_{\upsilon\upsilon'} \left(\frac{\hbar}{2m\omega_q}\right)^{\frac{1}{2}}$$

$$C_q e^{iq\tau}[U_{K+Q}]^{\upsilon\tau}[U_K^\dagger]^{\tau\upsilon'}(\gamma_{K+Q}^\upsilon)^\dagger \gamma_K^{\upsilon'}(a_q + a_{-q}^\dagger)$$

The sum goes over all K inside the reduced Brioullin zone, and all q vectors in the Brioullin zone of the pristine material. This is equivalent to allowing umklapp scattering, but only within the Brioullin zone of the pristine material, in order to make a meaningful comparison with the pristine material.

Finally the new interaction matrix element is given by:

$$H_{el\text{-}ph} = \frac{i}{N} \sum_{KQ,l} \sum_{\upsilon\upsilon'} g_{K,q}^{\upsilon'\upsilon}(\gamma_{K+Q}^\upsilon)^\dagger \gamma_K^{\upsilon'}(a_q + a_{-q}^\dagger)$$

with the coupling vertex for the new eigenstates given by:

$$g_{K,q}^{\upsilon'\upsilon} = C_q \left(\frac{\hbar}{2m\omega_q}\right)^{\frac{1}{2}} \sum_\tau e^{iq\tau}[U_{K+Q}]^{\upsilon\tau}[U_K^\dagger]^{\tau\upsilon'}$$

The constant C is allowed to have a q dependence. This stems from the spatial dependence of the deformation potential, and reflects the interaction matrix element in real materials such as $MgB_2$.

As described above, the electron-phonon coupling parameter $\lambda$ for the pristine material is be expressed as:

$$\lambda^{pristine} = \sum_{k,q} \frac{2}{\omega_q N(0)} |g_{k,k+q}|^2 \delta(\varepsilon_k) \delta(\varepsilon_{k+q})$$

By replacing the interaction matrix element $g_{k,k+q}$ of the pristine material with the interaction matrix element $g_{K,K+q}^{\upsilon\upsilon'}$ of the material with the periodic patterned nanostructure formed therein, and summing over the 'large' Brioullin zone of the pristine material, this yields:

$$\lambda^{SC} = \sum_{K,q,\upsilon,\upsilon'} \frac{2}{\omega_q N(0)} |g_{K,K+q}^{\upsilon\upsilon'}|^2 \delta(\xi_K^\upsilon) \delta(\xi_{K+q}^{\upsilon'})$$

with $g_{K,K+q}^{\upsilon\upsilon'}$ as defined above and with $\upsilon,\upsilon'$ as the band indices of the new bands. These back-folded bands (also known as 'shadow bands') can thus in principle help to overcome the kinematic constraints discussed above. The scattering between the backfolded bands correspond to umklapp scattering between different new Brioullin zones, including an amplitude for umklapp scattering in between the new, 'smaller' Brioullin zones. The transformation between old and new basis leads to a weighting of the scattering that connects different states, which is closely related to the overlap of the new states with the states of the pristine material (denoted by the lines shown in FIG. 8b). It is this weight that ensures that in the limit of large supercells the effect must vanish. Choosing the shape and size of the supercell allows to change the weight and have the new scattering vectors align with points of high interaction matrix element Here, we have absorbed this weighting into the new interaction matrix element $g_{K,K+q}^{\upsilon\upsilon'}$.

FIG. 8c compares the density of the electronic states of the pristine material (red) and the material with the periodic patterned nanostructure formed therein. FIG. 8d illustrates the phase space for scattering, in which the lighter regions shows how much phase space is available, while the darker regions depict the coupling strength of different q-vectors. In the pristine material, only small scattering vectors are allowed due to the kinematic constraints. On the other hand, in the modified material, there is a weak but finite weight in at larger q where the interaction is stronger. FIGS. 8e and 8f indicate the extent of coupling of different modes as a plot (FIG. 8e) and along a high-symmetry direction (FIG. 8f) where the width of the graph line indicates the contribution of a phonon with that wave-vector.

The determined electron-phonon coupling parameter $\lambda^{SC}$ of the material with the periodic patterned nanostructure formed therein can be incorporated into the aforementioned equations based on BCS theory or Allen-Dynes approximation in Eliashberg theory in order to determine the transition temperature $T_{CM}$.

Qualitatively, to achieve the highest electron-phonon coupling parameter $\lambda$, there is a need to move weight from the original Fermi surface to match with the points of strongest electron-phonon coupling. For example, in many materials the interaction matrix elements favour certain large scattering vectors. It is beneficial to have many processes where these wave-vectors can scatter, which is achieved as described above as a result of the shadow bands covering much more area in the Brillouin zone and thereby more phase space becoming available where it matters. This is relevant for materials like $MgB_2$, where the coupling is strong for a small region in q space only, and giving more space in k space would be beneficial. This could also weaken the Kohn anomaly and thus increase the phonon energy, further benefiting the superconductivity.

Figure 9:
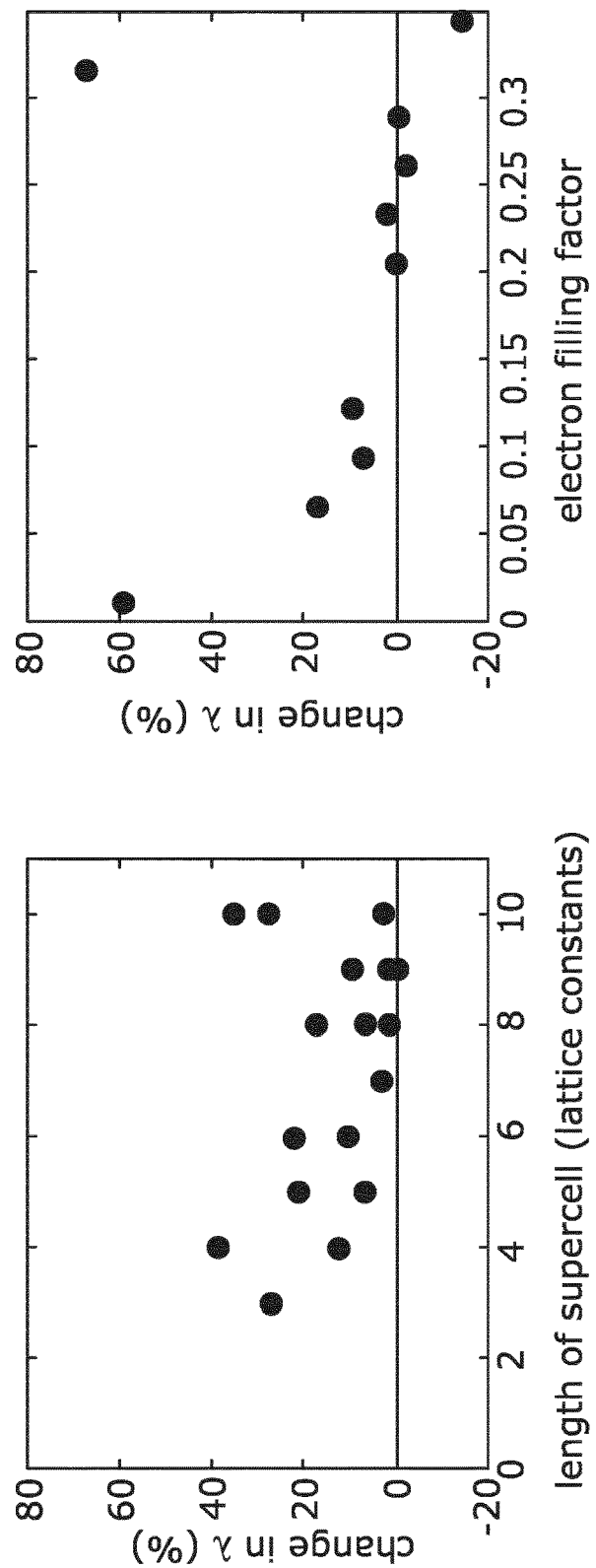

FIG. 9a shows the results of a quantitative analysis of different supercell shapes and sizes, where the quantitative analysis is carried out using the above model. FIG. 9b shows the total electron-phonon coupling as a function of electron filling factor. Any enhancement/downturn in the electron-phonon coupling partly stems from changes in the density of states, and partly stem from alterations of the phase space. It can be seen from FIG. 9 that there is a clear dependence of the increase in the electron-phonon coupling parameter $\lambda$ on the lattice constant and shape of the supercell.

Numerical methods can be used to predict the required design parameters to improve superconductivity in materials including Al, NbTi, and $MgB_2$. Using numerical calculation software, we can calculate the of the electron-phonon coupling parameter $\lambda$ based on a model similar to above. Inserting the Interaction matrix element into the electron-phonon coupling parameter $\lambda_{SC}$ yields:

$$\lambda^{SC} = \sum_{K,q,\upsilon,\upsilon'} \frac{2}{\omega_q N(0)} |g_{K,K+q}^{\upsilon\upsilon'}|^2 \delta(\xi_K^\upsilon) \delta(\xi_{K+q}^{\upsilon'})$$

$$= \sum_{K,q,\upsilon,\upsilon'} \frac{2}{\omega_q N(0)} \left| C_q \left(\frac{\hbar}{2mN\omega_q}\right)^{\frac{1}{2}} \sum_\tau e^{iq\tau} [U_{K+Q}]^{\upsilon\tau} [U_K^\dagger]^{\tau\upsilon'} \right|^2 \delta(\xi_K^\upsilon) \delta(\xi_{K+q}^{\upsilon'})$$

$$= \sum_{k,q} \frac{2}{\omega_q N(0)} C_q^2 \frac{\hbar}{2N\omega_q} \sum_{\upsilon\upsilon'} \left| \sum_\tau e^{iq\tau} [U_{K+Q}]^{\upsilon\tau} [U_K^\dagger]^{\tau\upsilon'} \right|^2 \delta(\xi_K^\upsilon) \delta(\xi_{K+q}^{\upsilon'})$$

$$= \sum_{k,q} F_q \sum_{\upsilon\upsilon'} \left| \sum_\tau e^{iq\tau} [U_{K+Q}]^{\upsilon\tau} [U_K^\dagger]^{\tau\upsilon'} \right|^2 \delta(\xi_K^\upsilon) \delta(\xi_{K+q}^{\upsilon'})$$

with $$F_q = \frac{2C_q^2}{\omega_q N(0)} \frac{\hbar}{2mN\omega_q} = \frac{2}{N(0)} \frac{\hbar}{2mN} \cdot \frac{1}{\omega_q^2} \cdot C_q^2$$

The terms taken outside the sum are positive and independent of $\upsilon\upsilon'$. $\Delta_{Kq}$ is further defined such that $\lambda^{SC} = \Sigma_{K,q} \lambda_{Kq}$.

The above exemplary model based on the alteration of the electronic structure of the primary layer of the material may be expanded to include the effect of a periodic patterned nanostructure on the phononic dispersion of the primary layer of the material in order to create or alter the or each phonon in the material. Starting from:

$$\vec{\nabla} \cdot u_x = \frac{i}{N} \sum_q (\sin^2 q_x + \sin^2 q_y)^{\frac{1}{2}} e^{iq \cdot x} u_q$$

$u_q$ is replaced by the eigenmodes of the system with supercell, as described below. This is given by:

$$u_q = \frac{1}{L} \sum_{\tau,\rho} \sqrt{\frac{m}{m_\tau}} \, e^{-iq\tau} P_Q^{\tau\rho} \mu_Q^\rho$$

Again, by writing $$q = \frac{2\pi}{La} l + Q$$

such that the sums over q become double sums, it is found that:

$$\tilde{C}\vec{\nabla} \cdot u_x = \frac{i}{NL} \sum_q \sum_{\tau'\rho} C_q \sqrt{\frac{m}{m_\tau}} \, e^{iq \cdot (R+\tau-\tau')} P_Q^{\tau'\rho} \mu_Q^\rho$$

$$= \frac{i}{NL} \sum_Q \sum_{\tau'\rho} e^{iQ \cdot (R+\tau-\tau')} \sum_l C_q \sqrt{\frac{m}{m_\tau}} \, e^{i\frac{2\pi}{La} l(\tau-\tau')} P_Q^{\tau'\rho} \mu_Q^\rho$$

$$= \frac{i}{NL} \sum_Q \sum_{\tau'\rho} e^{iQ \cdot R} C_Q^{\tau\tau'} \sqrt{\frac{m}{m_\tau}} \, P_Q^{\tau'\rho} \mu_Q^\rho$$

with $C_Q^{\tau\tau'} = e^{iQ \cdot (\tau-\tau')} \frac{1}{L} \sum_l C_q e^{i\frac{2\pi}{La} l(\tau-\tau')}$ The interaction Hamiltonian is then given by:

$$H_{el-ph} = \sum_{x=R+\tau} \tilde{C}\vec{\nabla} \cdot u(x) c_x^\dagger c_x$$

$$= \frac{i}{M^2 N} \sum_{R,\tau} \sum_{KK'} \sum_{Q,\tau'} \sum_{\upsilon\upsilon'} \sum_\rho$$

$$e^{i(K-K'-Q) \cdot R} [U_K]^{\upsilon\tau} [U_{K'}^\dagger]^{\tau\upsilon'} (\gamma_K^\upsilon)^\dagger \gamma_{K'}^{\upsilon'} \times$$

$$C_q^{\tau\tau'} P_Q^{\tau'\rho} \left(\frac{\hbar}{2m\omega_Q^\rho}\right)^{\frac{1}{2}} (a_Q^\rho + (a_{-Q}^\upsilon)^\dagger)$$

$$= \frac{i}{N} \sum_{KQ} \sum_{\tau\tau'} \sum_{\upsilon\upsilon'} \sum_\rho \left(\frac{\hbar}{2m\omega_Q^\rho}\right)^{\frac{1}{2}}$$

$$C_q^{\tau\tau'} [U_{K+Q}]^{\upsilon\tau} [U_K^\dagger]^{\tau\upsilon'}$$

$$(\gamma_{K+Q}^\upsilon)^\dagger \gamma_K^{\upsilon'} P_Q^{\tau'\rho} (a_Q^\rho + (a_{-Q}^\rho)^\dagger)$$

$$= \frac{i}{N} \sum_{KQ} \sum_{\upsilon\upsilon'} \sum_\rho g_{KQ}^{\upsilon\upsilon'\rho} (\gamma_{K+Q}^\upsilon)^\dagger \gamma_K^{\upsilon'} (a_Q^\rho + (a_{-Q}^\rho)^\dagger)$$

with the interaction matrix element $$g_{KQ}^{\upsilon\upsilon'\rho} = \sum_{\tau\tau'} \left(\frac{\hbar}{2m_{\tau'}\omega_Q^\rho}\right)^{\frac{1}{2}} C_Q^{\tau\tau'} [U_{K+Q}]^{\upsilon\tau} [U_K^\dagger]^{\tau\upsilon'} P_Q^{\tau'\rho}.$$

The above interaction matrix element $g_{KQ}^{\upsilon\upsilon'\rho}$ can then be applied to obtain the new electron-phonon coupling parameter $\lambda_{SC}$, which in turn can be incorporated into the aforementioned equations based on BCS theory or Allen-Dynes approximation in Ellashberg theory in order to determine the transition temperature transition temperature $T_{CM}$.

Alternatively the effect of the periodic patterned nanostructure on the phonons only in the material can also be calculated using the following model based on the SSH Hamiltonian. In this model, the following notations are used:

$$R, R' \in \{1, \ldots, M\}$$

$$\alpha, \beta \in \{1, \ldots, L\}$$

$$Q, Q' \in \left\{-\frac{\pi}{La}, \ldots, \frac{\pi}{La}\right\}$$

$$q \in \left\{-\frac{\pi}{a}, \ldots, \frac{\pi}{a}\right\}$$

The symbol q is used for elements of the unmodulated Brillouin zone, i.e. the Brillouin zone without periodic patterning. We can rescale the momentum and real space variables to get $\pi$ and $\xi$ to obtain the model Hamiltonian in terms of the rescaled variables:

$$H_{ph} = \sum_{R,\alpha} \frac{(\pi_R^\alpha)^2}{2m} + \sum_{R,R'} \sum_{\alpha,\beta}^{L} \xi_R^\alpha K_{RR'}^{\alpha\beta} \xi_{R'}^\beta$$

For a general periodic patterning with varying masses, the interaction matrix is given by an expression similar to above, where:

$$K_{RR'}^{\alpha\beta} = \frac{m\kappa}{\sqrt{m_\alpha m_\beta}}$$

$$[\delta_{R,R'}(2\delta_{\alpha,\beta} - \delta_{\alpha,\beta+1} - \delta_{\alpha,\beta-1}) - \delta_{R-1,R'}\delta_{\alpha,1}\delta_{\beta,L} + \delta_{R+1,R'}\delta_{\alpha,L}\delta_{\beta,1}]$$

This leads to the Hamiltonian in reciprocal space through Fourier transform:

$$H_{ph} = \sum_Q \sum_{\alpha,\beta}^{L} \xi_Q^\alpha K_Q^{\alpha\beta} \xi_{-Q}^\beta$$

$$K_Q^{\alpha\beta} = \frac{m\kappa}{\sqrt{m_\alpha m_\beta}}[(2\delta_{\alpha,\beta} - \delta_{\alpha,\beta+1} - \delta_{\alpha,\beta-1}) - \delta_{\alpha,1}\delta_{\beta,L}e^{iL\alpha Q} + \delta_{\alpha,L}\delta_{\beta,1}e^{-iL\alpha Q}]$$

Again, only the terms connecting neighbouring unit cells (the last two terms) pick up a Q dependence and the vector $\vec{\xi}_Q$ generalizes to $\vec{\xi}_Q = (\xi_Q^1, \ldots, \xi_Q^L)^T$ and the matrix $K_Q$ in $$\sum_Q \sum_{\alpha,\beta}^{L} \xi_Q^\alpha K_Q^{\alpha\beta} \xi_{-Q}^\beta = \sum_Q \vec{\xi}_Q^\dagger K_Q \vec{\xi}_Q.$$

In one dimension, the matrix takes the following form:

$$K_Q = m\kappa \begin{bmatrix} \frac{2}{m_1} & \frac{-1}{\sqrt{m_1 m_2}} & & & & \frac{-e^{-iL\alpha Q}}{\sqrt{m_1 m_L}} \\ \frac{-1}{\sqrt{m_2 m_1}} & \frac{2}{m_2} & & & & \\ & & \ddots & & & \\ & & & \frac{2}{m_{L-1}} & \frac{-1}{\sqrt{m_{L-1} m_L}} & \\ \frac{-e^{-iL\alpha Q}}{\sqrt{m_L m_1}} & & & \frac{-1}{\sqrt{m_L m_{L-1}}} & \frac{2}{m_L} \end{bmatrix}$$

The eigenvalues of this matrix correspond to the phononic dispersion in the material with the periodic patterned nanostructure formed therein. Since the electronic and phononic dispersions are now provided, the next step is to determine the interaction matrix element, or coupling function, $g_{k,q}^\alpha$. There exists a procedure for relating the general $g_{k,q}^\alpha$ to the analytically obtained monoatomic g(k, q).

The starting point is the one dimensional interaction Hamiltonian in which:

$$H_{el-ph} = \frac{1}{\sqrt{N}} \sum_{k,q} \tilde{g}(k,q) u_q c_{k+q/2}^\dagger c_{k-q/2}$$

where g(k,q) is the monoatomic matrix element. $u_q$ is rewritten in terms of the displacement variables $\mu_Q^v$ which diagonalize the phonons with periodic patterning. Since $u_q$ is a Fourier transform of $u_n$, $u_n$ is rewritten in terms of $\mu_q^v$:

$$u_n = \sqrt{\frac{m}{m_n}} \xi_n$$

$$= \sqrt{\frac{m}{m_\alpha}} \xi_R^\alpha$$

$$= \sqrt{\frac{m}{m_\alpha}} \frac{1}{\sqrt{M}} \sum_Q e^{iQx_R} \xi_Q^\alpha$$

$$= \sqrt{\frac{m}{m_\alpha}} \frac{1}{\sqrt{M}} \sum_Q e^{iQx_R} \sum_v C_Q^{\alpha v} \mu_Q^v$$

This transform is also used above in the model looking at the effect of both phonons and electrons. The above recalculation involves rescaling, relabelling to make use of the periodically recurring masses due to the periodic patterning, a Fourier transform, and finally a basis transformation $\vec{\xi}_Q = C_Q \vec{\mu}_Q$, with $C_Q$ as the matrix of eigenvectors of $K_Q$, analogous to the diatomic case, but now written in terms of components rather than in matrix notation.

Next is the substitution into the inverse Fourier transform of $u_n$:

$$u_q = \frac{1}{\sqrt{N}} \sum_n e^{-iqx_n} u_n$$

$$= \frac{1}{\sqrt{N}} \sum_n e^{-iqx_n} \sqrt{\frac{m}{m_\alpha}} \frac{1}{\sqrt{M}} \sum_Q e^{iQx_R} \sum_v C_Q^{\alpha v} \mu_Q^v$$

$$= \frac{\sqrt{m}}{\sqrt{N}\sqrt{M}} \sum_R \sum_\alpha e^{-iq(x_R + \alpha a)} \sqrt{\frac{1}{m_\alpha}} \sum_Q e^{iQx_R} \sum_v C_Q^{\alpha v} \mu_Q^v$$

$$= \frac{\sqrt{m}}{\sqrt{N}\sqrt{M}} \sum_R \sum_\alpha \sum_Q \sqrt{\frac{1}{m_\alpha}} e^{-ix_R(Q-q)} e^{-iq\alpha a} \sum_v C_Q^{\alpha v} \mu_Q^v$$

$$= \sqrt{m} \sqrt{\frac{M}{N}} \sum_\alpha \sum_Q \sqrt{\frac{1}{m_\alpha}} \delta_{Q,q} e^{-iq\alpha a} \sum_v C_Q^{\alpha v} \mu_Q^v$$

$$= \sqrt{m} \sqrt{\frac{M}{N}} \sum_{\alpha,v} \frac{e^{-iq\alpha a}}{\sqrt{m_\alpha}} C_q^{\alpha v} \mu_q^v$$

$$= \frac{1}{\sqrt{L}} \sum_{\alpha,v} \frac{e^{-iq\alpha a}}{\sqrt{m_\alpha}} C_q^{\alpha v} \mu_q^v$$

The first four steps above are substitutions of previously obtained results, and the delta function in the fifth step is based on the fact that the set which Q belongs to is a subset of the set to which q belongs. This means that the q appearing in the last two lines is in principle constrained to the smaller Brillouin zone, the elements of which we labelled Q until now. In the final step the arbitrary m has been set to be equal to one and the relation N=LM is used to rewrite the square root.

For compactness, the above is rewritten as:

$$u_q = \frac{1}{\sqrt{L}} \sum_{a,v} \frac{e^{-iqaa}}{\sqrt{m_a}} C_q^{av} \mu_q^v \equiv \sum_v \Gamma_q^v \mu_q^v$$

where the weight $\Gamma_q^v$ is defined as:

$$\Gamma_q^v = \frac{1}{\sqrt{L}} \sum_a \frac{e^{-iqaa}}{\sqrt{m_a}} C_q^{av}$$

$$= \frac{1}{\sqrt{L}} \sum_a I_q^a C_q^{av}$$

The above definition of the weight allows the old monoatomic states to be written as a superposition of the proper states diagonalizing the phononic Hamiltonian, and the coefficient of each eigenstate $\mu_Q^v$ is the number referred to as the weight. The solution for $\mu_q$ can be incorporated into the interaction Hamiltonian to yield:

$$H_{el-ph} = \frac{1}{\sqrt{N}} \sum_{k,q} \tilde{g}(k,q) \left[ \sum_v \Gamma_q^v \mu_q^v \right] c_{k+q/2}^\dagger c_{k-q/2}$$

Since $\mu_Q^v$ diagonalizes the phononic Hamiltonian, it can be expressed in terms of phonon creation and annihilation operators as:

$$\mu_Q^v = \sqrt{\frac{\hbar}{2m\omega_q^v}} (a_q^v + a_{-q}^v)$$

Setting $\hbar$ and the arbitrary m to one makes the Hamiltonian:

$$H_{el-ph} = \frac{1}{\sqrt{N}} \sum_{k,q} \sum_v \frac{\tilde{g}(k,q)}{\sqrt{2\omega_q^v}} \Gamma_q^v (a_q^v + a_{-q}^v) c_{k+q/2}^\dagger c_{k-q/2}$$

The band dependent interaction matrix element is then given as:

$$g_{k,q}^v = \frac{\tilde{g}(k,q)}{\sqrt{2\omega_q^v}} \Gamma_q^v$$

$$= \frac{1}{\sqrt{L}} \frac{\tilde{g}(k,q)}{\sqrt{2\omega_q^v}} \sum_a I_q^a C_q^{av}$$

$$= -\frac{1}{\sqrt{L}} \frac{4i\alpha \sin\left(\frac{qa}{2}\right)\cos(ka)}{\sqrt{2\omega_q^v}} \sum_a \frac{e^{-iqaa}}{\sqrt{m_a}} C_q^{av}$$

The above provides the coupling function for a general periodic patterning. With the identification $g_{k,q}^v = M_{k,k+q}^v$, it becomes possible to calculate the electron-phonon coupling parameter $\lambda$ for an arbitrary periodic patterning, which can then be incorporated into the aforementioned equations based on BCS theory or Allen-Dynes approximation in Eliashberg theory in order to determine the transition temperature transition temperature $T_{CM}$.

It will be understood that the chosen values for the parameters in the above embodiments are merely chosen to illustrate the working of the invention, and that other values for the parameters may be used in place of the chosen values.

The foregoing analytical models are intended to illustrate the working of the invention, and are provided in this patent specification to the best of the inventor's knowledge. It will be appreciated that the underlying theory behind the invention is based on quantum mechanics and that the foregoing analytical models are based on approximations of quantum theory and Schrodinger's equations.

It will be also appreciated that the aforementioned models and equations for determining the effect of the periodic patterned nanostructure on the superconductivity of the material can be supplemented or replaced by other models based on:

local density calculations to determine the phononic dispersion and/or the electronic dispersion of simple materials, with supercell sizes in the range of several tens of lattice sites, and even take into account effects from dangling bonds;

finite-element calculations in combination with a tight-binding approach to calculate the phononic dispersion and/or the electronic dispersion at very low frequencies, which can be useful for materials with branches dominating the electron-phonon coupling;

Monte Carlo simulations;

theoretical models connecting experimental results like ultrasonic attenuation with changes in the electron-phonon coupling parameter $\lambda$.

The invention claimed is:

1. A superconductor element comprising a material, the material comprising a primary layer, the material further including a periodic patterned structure formed therein, wherein the periodic patterned structure is arranged in the material to alter an electronic structure in the primary layer to couple with one or each phonon of the primary layer so as to induce superconductivity in the primary layer or modify the superconductivity of the primary layer.

2. The superconductor element according to claim 1 wherein the induction of superconductivity in the primary layer or the modification of the superconductivity of the primary layer includes an increase of the superconductor transition temperature of the primary layer.

3. The superconductor element according to claim 1 wherein the periodic patterned structure includes one or more nanostructures.

4. The superconductor element according to claim 1 wherein the primary layer is a graphene or metallic layer and/or a superconductor layer.

5. The superconductor element according to claim 1 wherein the periodic patterned structure is arranged in the material to modify an electronic dispersion of the primary layer.

6. The superconductor element according to claim 5 wherein at least one of the periodicity and a shape of the periodic patterned structure is arranged to define the electronic dispersion of the primary layer.

7. The superconductor element according to claim 1 wherein the periodic patterned structure is formed in the primary layer.

8. The superconductor element according to claim 1 wherein the material further includes at least one of:

a secondary layer on the primary layer, and the periodic patterned structure is formed in the secondary layer; and a secondary layer, the periodic patterned structure is formed in the secondary layer, and the primary layer is provided on the periodic patterned structure.

9. A superconductor element comprising a material, the material comprising a primary layer, the material further including a periodic patterned structure formed therein, wherein the periodic patterned structure is arranged in the material to create or alter one or more phonons in the primary layer to couple with electrons of the primary layer so as to induce superconductivity in the primary layer or modify the superconductivity of the primary layer, wherein the periodic patterned structure is arranged in the material to modify an electronic dispersion of the primary layer.

10. The superconductor element according to claim 9 wherein the induction of superconductivity in the primary layer or the modification of the superconductivity of the primary layer includes an increase of the superconductor transition temperature of the primary layer.

11. The superconductor element according to claim 9 wherein the periodic patterned structure includes one or more nanostructures.

12. The superconductor element according to claim 9 wherein at least one of the periodicity and a shape of the periodic patterned structure is arranged to define a phononic dispersion of the primary layer.

13. The superconductor element according to claim 9 wherein at least one of the periodicity and a shape of the periodic patterned structure is arranged to define the electronic dispersion of the primary layer.

14. The superconductor element according to claim 9 wherein the periodic patterned structure is formed in the primary layer.

15. The superconductor element according to claim 9 wherein the material further includes at least one of:

a secondary layer on the primary layer, and the periodic patterned structure is formed in the secondary layer; and a secondary layer, the periodic patterned structure is formed in the secondary layer, and the primary layer is provided on the periodic patterned structure.

* * * * *